United States Patent [19]
Rault et al.

[11] Patent Number: 5,214,678
[45] Date of Patent: May 25, 1993

[54] DIGITAL TRANSMISSION SYSTEM USING SUBBAND CODING OF A DIGITAL SIGNAL

[76] Inventors: Jean B. Rault; Yves F. Dehery, both of rue du Clos Courtel BP 59; Jean Y. Roudaut, rue du Clos Courtel, all of Cesson-Sevigne, France; Alphons A. M. L. Bruekers; Raymond N. J. Veldhuis, both of Groenewoudsweg 1, Eindhoven, Netherlands

[21] Appl. No.: 532,465
[22] Filed: May 31, 1990

[30] Foreign Application Priority Data
Jun. 2, 1989 [EP] European Pat. Off. ........ 89201408.5

[51] Int. Cl.⁵ .............................................. H04B 1/66
[52] U.S. Cl. ....................................... 375/122; 381/31
[58] Field of Search ............... 375/122, 7; 369/59; 360/32; 381/30, 31, 33, 37, 41, 29; 364/724.01, 724.1

[56] References Cited
U.S. PATENT DOCUMENTS

| 4,569,075 | 2/1986 | Nussbaumer | 381/29 |
| 4,799,179 | 1/1989 | Masson et al. | 364/724.1 |
| 4,896,362 | 1/1990 | Voldhuis et al. | 381/30 |
| 4,956,871 | 9/1990 | Swaminathan | 381/31 |

OTHER PUBLICATIONS

"The critical band coder—Digital Encoding of Speech Signals based on the perceptual requirement of the auditory system", Michael A. Krasner, IEEE, pp. 327-331 1980.
Stall et al, "Law bite rate coding of high-quality audio signals introduction to the Mascam System" EBU Review Technical No. 230, pp. 71-94 Aug. 1988.

Primary Examiner—Benedict V. Safourek
Assistant Examiner—Tesfaldet Bocure
Attorney, Agent, or Firm—David R. Treacy

[57] ABSTRACT

A digital transmission system is disclosed having a transmitter (3,6,9) and a receiver (13,16,19) for transmitting a digital signal, such as a digital audio signal, having a given sampling rate $F_S$. The digital signal is subband coded into M subbands with sampling rate reduction. To that purpose the transmitter includes a first unit (3) for splitting up the digital signal into M signals having a sampling rate $F_S/M$. These signals are available at the outputs (4.1 to 4.M) of the first unit (3), and are applied to M analysis filters (6.1 to 6.M), each filter (6.m) having one input (5.m) and two outputs (7.ma and 7.mb). The 2M filter outputs are coupled to 2M inputs (8.1 to 8.2M) of a signal processing unit 9 which has M outputs (10.1 to 10M) for supplying the M subband signals ($S_1$ to $S_M$). Each filter (6.m) is adapted to apply two different filterings on the signal applied to its input and to supply the two different filtered versions of the input signal to its two outputs. The signal processing unit 9 is adapted to supply output signals on each of the M outputs, an output signal being a combination of at least a number of input signals applied to its 2M inputs. On the receiver side a signal processing is carried out which is largely inverse to the signal processing on the transmitter side, in order to realize a signal at the output (21) that is a nearly perfect reconstruction of the input signal.

39 Claims, 14 Drawing Sheets

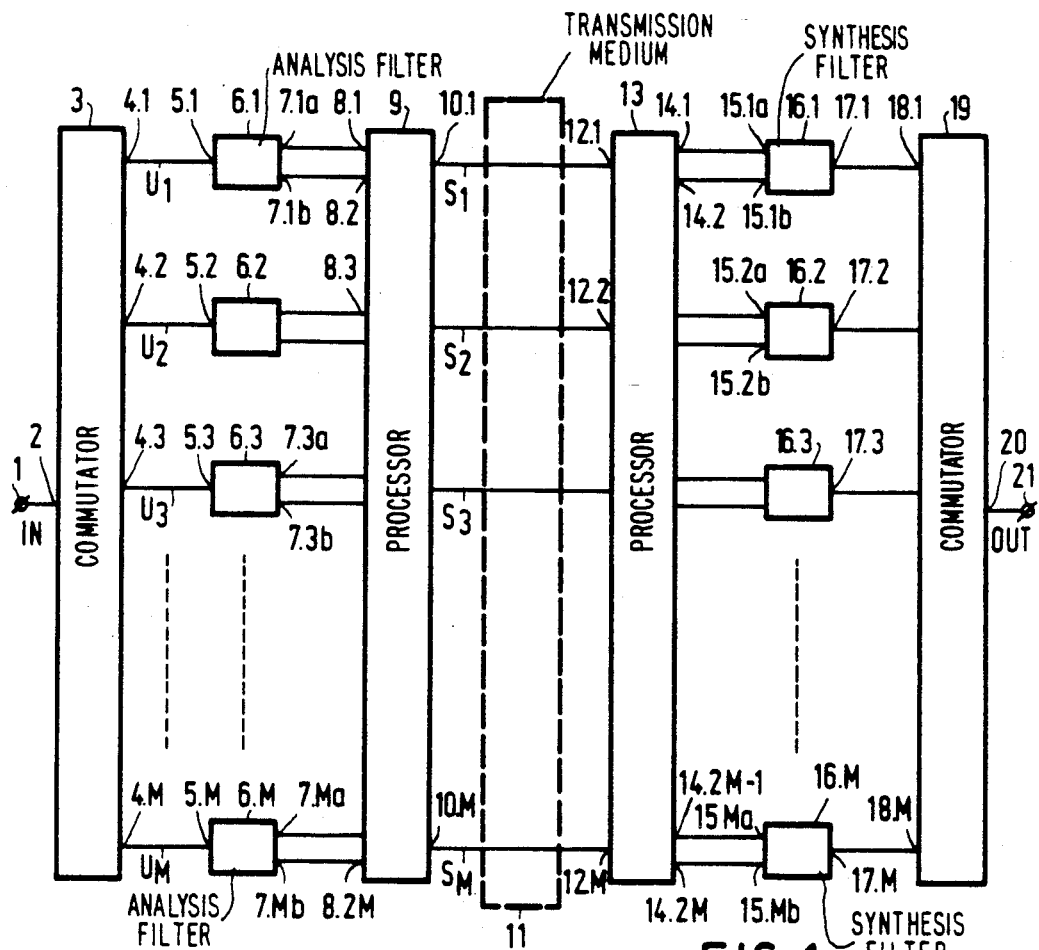

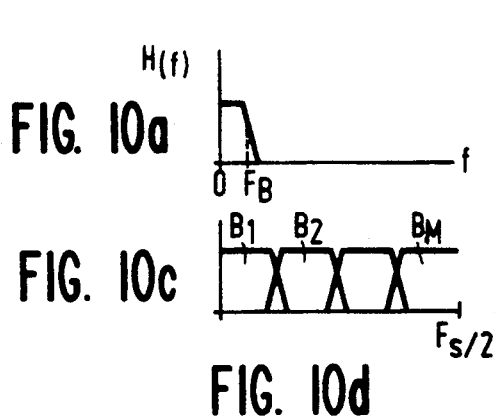
FIG. 10a
FIG. 10c
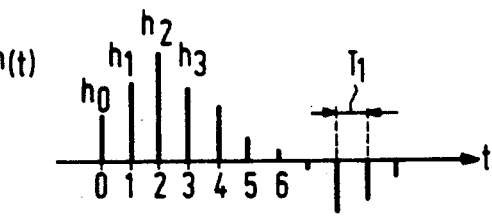
FIG. 10b
FIG. 10d
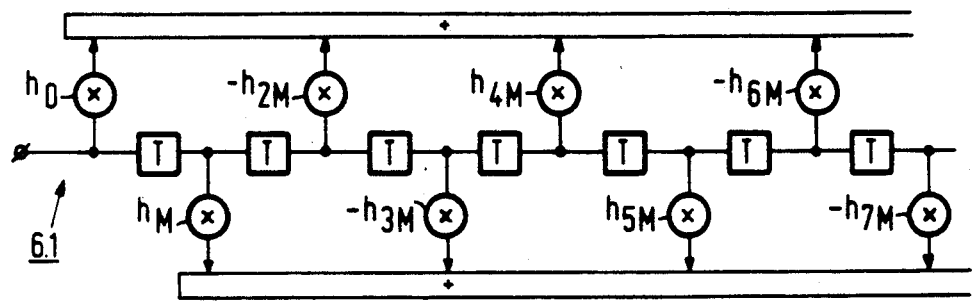
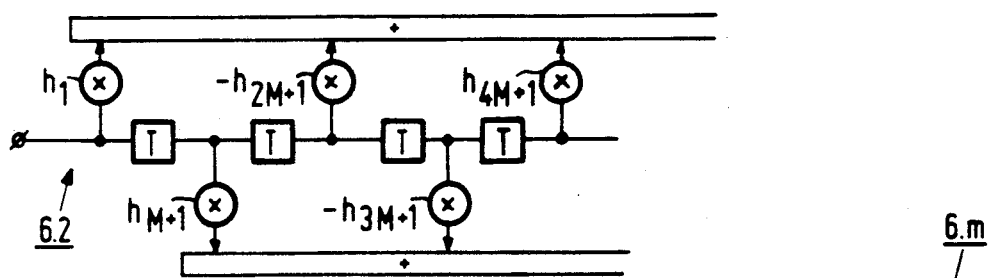
FIG. 10e
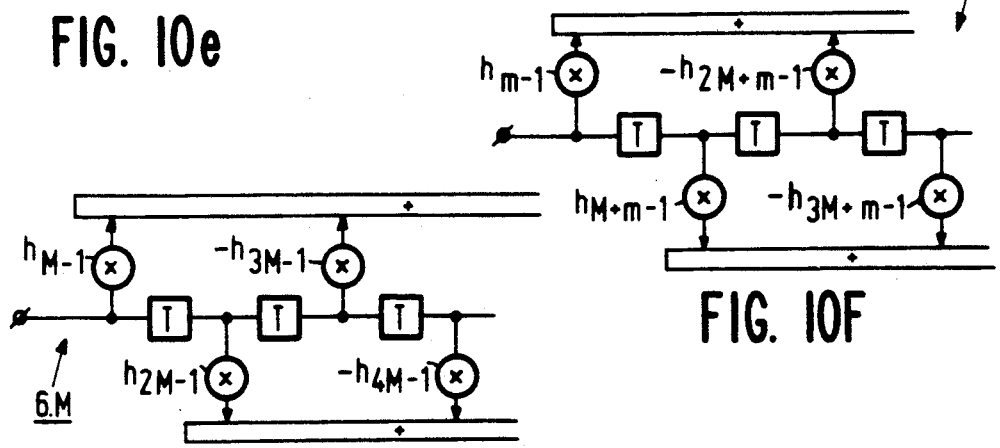
FIG. 10F
FIG. 10g $\alpha_{xy}$

| x= | y= | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| 1 | | 0.707107 | 0.707107 | 0.831470 | 0.555570 | 0.923880 | 0.382683 | 0.980785 | 0.195090 | 1.000000 | 0.000000 | 0.980785 | -0.195090 | 0.923880 | -0.382683 | 0.831470 | -0.555570 |
| 2 | | 0.707107 | -0.707107 | -0.195090 | -0.980785 | 0.382683 | -0.923880 | 0.831470 | -0.555570 | 1.000000 | 0.000000 | 0.831470 | 0.555570 | 0.382683 | 0.923880 | -0.195090 | 0.980785 |
| 3 | | 0.707107 | -0.707107 | -0.980785 | 0.195090 | -0.382683 | 0.923880 | 0.555570 | -0.831470 | 1.000000 | 0.000000 | 0.555570 | -0.831470 | -0.382683 | -0.923880 | -0.980785 | -0.195090 |
| 4 | | 0.707107 | 0.707107 | -0.555570 | 0.831470 | -0.923880 | -0.382683 | 0.195090 | -0.980785 | 1.000000 | 0.000000 | 0.195090 | 0.980785 | -0.923880 | 0.382683 | -0.555570 | -0.831470 |
| 5 | | 0.707107 | 0.707107 | 0.555570 | -0.831470 | -0.923880 | -0.382683 | -0.195090 | 0.980785 | 1.000000 | 0.000000 | -0.195090 | -0.980785 | -0.923880 | 0.382683 | 0.555570 | 0.831470 |
| 6 | | 0.707107 | -0.707107 | 0.980785 | -0.195090 | -0.382683 | 0.923880 | -0.555570 | 0.831470 | 1.000000 | 0.000000 | -0.555570 | 0.831470 | -0.382683 | -0.923880 | 0.980785 | 0.195090 |
| 7 | | 0.707107 | -0.707107 | 0.195090 | 0.980785 | 0.382683 | -0.923880 | -0.831470 | 0.555570 | 1.000000 | 0.000000 | -0.831470 | -0.555570 | 0.382683 | 0.923880 | 0.195090 | -0.980785 |
| 8 | | 0.707107 | 0.707107 | -0.831470 | -0.555570 | 0.923880 | 0.382683 | -0.980785 | -0.195090 | 1.000000 | 0.000000 | -0.980785 | 0.195090 | 0.923880 | -0.382683 | -0.831470 | 0.555570 |

FIG. 14a

$$\alpha_{xy}$$

| x= | y= 1 | 2 | 3 | 4 | 5 | 6 | 7 | 8 |
|---|---|---|---|---|---|---|---|---|
| 1 | 0.707107 | -0.707107 | -0.707107 | 0.707107 | 0.707107 | -0.707107 | -0.707107 | 0.707107 |
| 2 | -0.707107 | 0.707107 | 0.707107 | -0.707107 | -0.707107 | 0.707107 | 0.707107 | -0.707107 |
| 3 | 0.555570 | -0.980785 | 0.195090 | 0.831470 | -0.831470 | -0.195090 | 0.980785 | -0.555570 |
| 4 | -0.831470 | 0.195090 | 0.980785 | 0.555570 | -0.555570 | -0.980785 | -0.195090 | 0.831470 |
| 5 | 0.382683 | -0.923880 | 0.923880 | -0.382683 | -0.382683 | 0.923880 | -0.923880 | 0.382683 |
| 6 | -0.923880 | -0.382683 | 0.382683 | 0.923880 | 0.923880 | 0.382683 | -0.382683 | -0923880 |
| 7 | 0.195090 | -0.555570 | 0.831470 | -0.980785 | 0.980785 | -0.831470 | 0.555570 | -0.195090 |
| 8 | -0.980785 | -0.831470 | -0.555570 | -0.195090 | 0.195090 | 0.555570 | 0.831470 | 0.980785 |
| 9 | 0.000000 | 0.000000 | 0.000000 | 0.000000 | 0.000000 | 0.000000 | 0.000000 | 0.000000 |
| 10 | -1.000000 | -1.000000 | -1.000000 | -1.000000 | -1.000000 | -1.000000 | -1.000000 | -1.000000 |
| 11 | -0.195090 | 0.555570 | -0.831470 | 0.980785 | -0.980785 | 0.831470 | -0.555570 | 0.195090 |
| 12 | -0.980785 | -0.831470 | -0.555570 | -0.195090 | 0.195090 | 0.555570 | 0.831470 | 0.980785 |
| 13 | -0.382683 | 0.923880 | 0.923880 | 0.382683 | 0.382683 | -0.923880 | 0.923880 | -0.382683 |
| 14 | -0.923880 | -0.382683 | 0.382683 | 0.923880 | 0.923880 | 0.382683 | -0.382683 | -0.923880 |
| 15 | -0.555570 | 0.980785 | -0.195090 | 0.831470 | 0.831470 | 0.195090 | -0.980785 | 0.555570 |
| 16 | -0.831470 | 0.195090 | 0.980785 | 0.555570 | -0.555570 | -0.980785 | -0.195090 | 0.831470 |

FIG. 14b

|  | m=1 | m=2 | m=3 | m=4 |
|---|---|---|---|---|
| $\alpha_{om}$ | 0.000000000000E+000 | -1.125743279792E-006 | -2.309778870789E-006 | -4.375300768003E-006 |
|  | -5.651056006465E-005 | -8.365624375053E-005 | -1.191716111159E-004 | -1.634573198230E-004 |
|  | 4.409777183369E-004 | 4.667627879053E-004 | 4.595562681764E-004 | 4.063934402509E-004 |
|  | -9.287922047996E-004 | -1.429998555824E-003 | -1.982683016328E-003 | -2.555984489389E-003 |
|  | 3.970628862449E-003 | 3.532623189115E-003 | 2.719214046830E-003 | 1.496289129569E-003 |
|  | -1.002667672173E-002 | -1.277770232641E-002 | -1.529566154027E-002 | -1.735583793213E-002 |
|  | 1.250582368477E-002 | 7.114924905726E-003 | -2.373922354461E-006 | -8.818440634321E-003 |
|  | -7.165157960042E-002 | -8.558941585606E-002 | -9.895032702828E-002 | -1.112550048227E-001 |
|  | 1.429496022571E-001 | 1.415786681357E-001 | 1.375096567008E-001 | 1.309130315251E-001 |
|  | 7.165157960042E-002 | 5.761502139288E-002 | 4.393432035871E-002 | 3.102023058489E-002 |
|  | 1.250582368477E-002 | 1.621948431702E-002 | 1.837213863340E-002 | 1.913446539357E-002 |
|  | 1.002667672173E-002 | 7.241221420671E-003 | 4.586939418818E-003 | 2.192235058403E-003 |
|  | 3.970628862449E-003 | 4.084194705099E-003 | 3.934648779724E-003 | 3.587707875914E-003 |
|  | 9.287922047996E-004 | 4.992853443330E-004 | 1.519314831047E-004 | -1.111018284468E-004 |
|  | 4.409777183369E-004 | 3.940215106503E-004 | 3.359481906661E-004 | 2.746734587784E-004 |
| $\alpha_{nm}$ | 5.651056006467E-005 | 3.669948159169E-005 | 2.290382244772E-005 | 1.372963274721E-005 |

|  | m=5 | m=6 | m=7 | m=8 |
|---|---|---|---|---|
| $\alpha_{om}$ | -7.911603287751E-006 | -1.372963274719E-005 | -2.290382244771E-005 | -3.669948159168E-005 |
|  | -2.159455868186E-004 | -2.746734587784E-004 | -3.359481906661E-004 | -3.940215106503E-004 |
|  | 2.942015890109E-004 | 1.111018284468E-004 | -1.519314831047E-004 | -4.992853443330E-004 |
|  | -3.108217659565E-003 | -3.587707875914E-003 | -3.934648779724E-003 | -4.084194705100E-003 |
|  | -1.469947276883E-004 | -2.192235058404E-003 | -4.586939418819E-003 | -7.241221420672E-003 |
|  | -1.871719572738E-002 | -1.913446539358E-002 | -1.837213863340E-002 | -1.621948431702E-002 |
|  | -1.922275084523E-002 | -3.102023058489E-002 | -4.393432035872E-002 | -5.761502139289E-002 |
|  | -1.220464497130E-001 | -1.309130315252E-001 | -1.375096567009E-001 | -1.415758681357E-001 |
|  | 1.220464497130E-001 | 1.112550048226E-001 | 9.895032702827E-002 | 8.556941585606E-002 |
|  | 1.922275084523E-002 | 8.818440634320E-003 | 2.373922354465E-006 | -7.114924905726E-003 |
|  | 1.871719572738E-002 | 1.735583793213E-002 | 1.529566154027E-002 | 1.277770232640E-002 |
|  | 1.469947276883E-004 | -1.496289129570E-003 | -2.719214046831E-003 | -3.532623189115E-003 |
|  | 3.108217659564E-003 | 2.555984489389E-003 | 1.982683016327E-003 | 1.429998555823E-003 |
|  | -2.942015890110E-004 | -4.063934402510E-004 | -4.595562681765E-004 | -4.667627879054E-004 |
|  | 2.159455868186E-004 | 1.634573198230E-004 | 1.191716111158E-004 | 8.365624375056E-005 |
| $\alpha_{nm}$ | 7.911603287760E-006 | 4.375300768005E-006 | 2.309778870784E-006 | 1.125743279808E-006 |

FIG. 14c

$\alpha_{xy}$

| x= \ y= | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 1 | 0.634393 | -0.773010 | 0.471397 | -0.881921 | 0.290285 | -0.956940 | 0.098017 | -0.995185 | -0.098017 | -0.995185 | -0.290285 | -0.956940 | -0.471397 | -0.881921 | -0.634393 | -0.773010 |
| 2 | 0.881921 | -0.471397 | 0.995185 | 0.098017 | 0.773010 | 0.634393 | 0.290285 | 0.956940 | -0.290285 | 0.956940 | -0.773010 | 0.634393 | -0.995185 | 0.098017 | -0.881921 | -0.471397 |
| 3 | 0.290285 | -0.956940 | -0.634393 | -0.773010 | -0.995185 | 0.098017 | -0.471397 | 0.881921 | 0.471397 | 0.881921 | 0.995185 | 0.098017 | 0.634393 | -0.773010 | -0.290285 | -0.956940 |
| 4 | 0.995185 | -0.098017 | 0.290285 | 0.956940 | -0.881921 | 0.471397 | -0.634393 | -0.773010 | 0.634393 | -0.773010 | 0.881921 | 0.471397 | -0.290285 | 0.956940 | -0.995185 | -0.098017 |
| 5 | -0.098017 | -0.995185 | -0.956940 | 0.290285 | 0.471397 | 0.881921 | 0.773010 | -0.634393 | -0.773010 | -0.634393 | -0.471397 | 0.881921 | 0.956940 | 0.290285 | 0.098017 | -0.995185 |
| 6 | 0.956940 | 0.290285 | -0.773010 | 0.634393 | -0.098017 | -0.995185 | 0.881921 | 0.471397 | -0.881921 | 0.471397 | 0.098017 | -0.995185 | 0.773010 | 0.634393 | -0.956940 | 0.290285 |
| 7 | -0.471397 | -0.881921 | -0.098017 | 0.995185 | 0.634393 | -0.773010 | -0.956940 | 0.290285 | 0.956940 | 0.290285 | -0.634393 | -0.773010 | 0.098017 | 0.995185 | 0.471397 | -0.881921 |
| 8 | 0.773010 | 0.634393 | -0.881921 | -0.471397 | 0.956940 | 0.290285 | -0.995185 | -0.098017 | 0.995185 | -0.098017 | -0.956940 | 0.290285 | 0.881921 | -0.471397 | -0.773010 | 0.634393 |

*FIG. 15a*

$$\alpha_{xy}$$

| x= | y=1 | 2 | 3 | 4 | 5 | 6 | 7 | 8 |
|---|---|---|---|---|---|---|---|---|
| 1 | 0.773010 | 0.471397 | 0.956940 | 0.098017 | 0.995185 | -0.290285 | 0.881921 | -0.634393 |
| 2 | 0.634393 | 0.881921 | 0.290285 | 0.995185 | -0.098017 | 0.956940 | -0.471397 | 0.773010 |
| 3 | 0.881921 | -0.098017 | 0.773010 | -0.956940 | -0.290285 | -0.634393 | -0.995185 | 0.471397 |
| 4 | 0.471397 | 0.995185 | -0.634393 | 0.290285 | -0.956940 | -0.773010 | -0.098017 | -0.881921 |
| 5 | 0.956940 | -0.634393 | -0.098017 | -0.471397 | -0.881921 | 0.995185 | 0.773010 | -0.290285 |
| 6 | 0.290285 | 0.773010 | -0.995185 | -0.881921 | 0.471397 | -0.098017 | 0.634393 | 0.956940 |
| 7 | 0.995185 | -0.956940 | -0.881921 | 0.773010 | 0.634393 | -0.471397 | -0.290285 | 0.098017 |
| 8 | 0.098017 | 0.290285 | -0.471397 | -0.634393 | 0.773010 | 0.881921 | -0.956940 | -0.995185 |
| 9 | 0.995185 | -0.956940 | -0.881921 | 0.773010 | 0.634393 | -0.471397 | -0.290285 | 0.098017 |
| 10 | -0.098017 | -0.290285 | 0.471397 | 0.634393 | -0.773010 | -0.881921 | 0.956940 | 0.995185 |
| 11 | 0.956940 | -0.634393 | -0.098017 | -0.471397 | -0.881921 | 0.995185 | 0.773010 | -0.290285 |
| 12 | -0.290285 | -0.773010 | 0.995155 | 0.881921 | -0.471397 | 0.098017 | -0.634393 | -0.956940 |
| 13 | 0.881921 | -0.098017 | 0.773010 | -0.956940 | -0.290285 | -0.634393 | -0.995185 | 0.471397 |
| 14 | -0.471397 | -0.995185 | 0.634393 | -0.290285 | 0.956940 | 0.773010 | 0.098017 | 0.881921 |
| 15 | 0.773010 | 0.471397 | 0.956940 | 0.098017 | 0.995185 | -0.290285 | 0.881921 | -0.634393 |
| 16 | -0.634393 | -0.881921 | -0.290285 | -0.995185 | 0.098017 | -0.956940 | 0.471397 | -0.773010 |

FIG. 15b

|  | m = 1 | m = 2 | m = 3 | m = 4 |
|---|---|---|---|---|
| $\alpha_{om}$ | -0.000006864 | -0.000012066 | -0.000017945 | -0.000023822 |
|  | -0.000027413 | -0.000021448 | -0.000015149 | -0.000010485 |
|  | 0.000076330 | 0.000106429 | 0.000132695 | 0.000145907 |
|  | -0.000411472 | -0.000718016 | -0.001091056 | -0.001513963 |
|  | 0.002985591 | 0.002743399 | 0.002173260 | 0.001226473 |
|  | -0.009015025 | -0.011620369 | -0.014037416 | -0.016032039 |
|  | 0.010718051 | 0.005059027 | -0.002417056 | -0.011679944 |
|  | -0.077205460 | -0.091476873 | -0.104986604 | -0.117212139 |
|  | 0.144530152 | 0.141616726 | 0.135914256 | 0.127664368 |
|  | 0.062700586 | 0.048469218 | 0.034972535 | 0.022605254 |
|  | 0.014616596 | 0.016886280 | 0.017718595 | 0.017347635 |
|  | 0.006422689 | 0.004004989 | 0.001880537 | 0.000124915 |
|  | 0.002961552 | 0.002738731 | 0.002383966 | 0.001958420 |
|  | 0.000177740 | 0.000014811 | -0.000085354 | -0.000134492 |
|  | 0.000048905 | 0.000027980 | 0.000015035 | 0.000009722 |
| $\alpha_{nm}$ | 0.000031619 | 0.000033287 | 0.000032255 | 0.000028872 |

|  | m = 5 | m = 6 | m = 7 | m = 8 |
|---|---|---|---|---|
| $\alpha_{om}$ | -0.000028872 | -0.000032255 | -0.000033287 | -0.000031619 |
|  | -0.000009722 | -0.000015035 | -0.000027980 | -0.000048905 |
|  | 0.000134492 | 0.000085354 | -0.000014811 | -0.000177740 |
|  | -0.001958420 | -0.002383966 | -0.002738731 | -0.002961552 |
|  | -0.000124915 | -0.001880537 | -0.004004989 | -0.006422689 |
|  | -0.017347635 | -0.017718595 | -0.016886280 | -0.014616596 |
|  | -0.022605254 | -0.034972535 | -0.048469218 | -0.062700586 |
|  | -0.127664368 | -0.135914256 | -0.141616726 | -0.144530152 |
|  | 0.117212139 | 0.104986604 | 0.091476873 | 0.077205460 |
|  | 0.011679944 | 0.002417056 | -0.005059027 | -0.010718051 |
|  | 0.016032039 | 0.014037416 | 0.011620369 | 0.009015025 |
|  | -0.001226473 | -0.002173260 | -0.002743399 | -0.002985591 |
|  | 0.001513963 | 0.001091056 | 0.000718016 | 0.000411472 |
|  | -0.000145907 | -0.000132695 | -0.000106429 | -0.000076330 |
|  | 0.000010485 | 0.000015149 | 0.000021448 | 0.000027413 |
| $\alpha_{nm}$ | 0.000023822 | 0.000017945 | 0.000012066 | 0.000006864 |

FIG. 15c

DIGITAL TRANSMISSION SYSTEM USING SUBBAND CODING OF A DIGITAL SIGNAL

BACKGROUND OF THE INVENTION

The invention relates to a digital transmission system having a transmitter and a receiver, the transmitter including a coder and the receiver including a decoder, for subband coding of a digital signal, such as a digital audio signal, having a given sampling rate $F_S$. The coder is responsive to the digital signal, for generating a number of M sub-band signals with sampling rate reduction, and divides the digital signal band into successive subbands of band numbers $m (1 \leq m \leq M)$ increasing with frequency. The decoder is responsive to the M subband signals for constructing a replica of the digital signal, and merges the subbands to the digital signal band, with sampling rate increase. The invention also relates to a transmitter and a receiver for use in the transmission system, a coder for use in the transmitter, a decoder for use in the receiver, an analysis filter for use in the coder, a synthesis filter for use in the decoder, and a digital audio signal recording or reproducing apparatus comprising the transmitter and the receiver respectively.

A system for subband coding is known from the article entitled "The critical Band Coder-Digital encoding of speech signals based on the perceptual requirements of the auditory system" by M. E. Krasner, Proc. IEEE ICASSP80, Vol. 1, pp. 327-311, Apr. 9-11, 1980. In this known system, use is made of a subdivision of the speech signal band into a number of subbands, whose bandwidths approximately correspond with the bandwidth of the critical bands of the human auditory system in the respective frequency ranges (compare FIG. 2 in the article by Krasner). This subdivision has been chosen because on the basis of psycho acoustic experiments it may be expected that in a such like subband the quantization noise will be optimally masked by the signals within this subband when the quantizing takes account of the noise masking curve of the human auditory system (this curve indicates the threshold for masking the noise in a critical band by a single tone in the centre of the critical band, compare FIG. 3 in Krasner's article.

SUMMARY OF THE INVENTION

The invention has for its object to provide a digital transmission system of the type in which the information transmitted via the transmission medium between the transmitter and the receiver is divided in subbands having all approximately the same bandwidth, and (1) the system is constructed such that practically no distortion because of aliasing occurs in the reconstructed signal at the receiver side, and (2) the coder and decoder are very efficient with respect to computation time and complexity of the circuitry needed.

The digital transmission system in accordance with the with the invention is characterized in that the coder comprises analysis filters and a signal processing unit. M analysis filters each have one input and two outputs, the 2M outputs on the filters being coupled to 2M outputs of the analysis filter for supplying 2M output signals with a sampling rate $F_S/M$. Each analysis filter is adapted to apply two different filterings on the signal applied to its input and to supply each of the two different filtered versions of that input signal to a corresponding one of the two outputs, each one of the 2M filter outputs being coupled to a corresponding one of 2M inputs of a signal processing unit. The processing unit has M outputs coupled to M outputs of the coder for supplying the M subband signals, the signal processing unit being adapted to supply output signals on each of M outputs, an output signal being a combination of at least a number of input signals applied to its 2M inputs.

The decoder comprises another signal processing unit and synthesis filters, the other signal processing unit having M inputs for receiving the M subband signals and having 2M outputs. The synthesis filters comprise M synthesis filters each having 2 inputs, and one output coupled to the decoder output. The other signal processing unit is adapted to generate an output signal on each of its 2M outputs, an output signal being a combination of at least a number of input signals applied to its M inputs, each pair of outputs of the other signal processing unit being coupled to a pair of two inputs of a corresponding one of the M synthesis filters. Each synthesis filter has one output, each synthesis filter being adapted to apply different filterings on the two signals applied to the two inputs and to supply a combination of the two filtered signals to its output. Each output can be coupled to the output of the synthesis filter for supplying the replica of the digital signal having a sampling rate $F_S$.

The coder is adapted to divide the digital signal band into successive subbands having approximately equal bandwidths. The coefficients of each of the analysis and synthesis filters are derived from the coefficients of a standard filter having a low pass filter characteristic with a bandwidth approximatly equal to half the bandwidth of the subbands.

The measures according to the invention are based on the recognition that computation can be greatly simplified by arranging a sample rate decreaser in the form of the first unit before the analysis filters in the transmitter and by arranging a sample rate increaser in the form of the second unit behind the synthesis filters in the receiver. As a result the computations are now applied on signals with a lower sampling rate. It is should be noted that the publication "Digital filtering by polyphase network: application to sample-rate alteration and filter banks" by M. G. Bellanger et al in IEEE Trans. on ASSP, Vol. 24, No. 2, April 1976, pp. 109-114 discloses a system in which a digital signal is divided into a number of subbands by means of a number of filters which are preceded by a sample rate decreaser. Such a construction simplifies computation in the filters in that signal processing in these filters can be applied to signals having a decreased sampling rate.

The transmitter in the known system however does not generate subbands of substantially equal bandwidths, in that the lowest subband in the known system has a bandwidth of half the bandwidth of the other bandwidths. Moreover the filters and the processing unit in the known system differ from the filters and the processing unit in the system according to the invention, in that thé filters apply two different filterings on the signals applied to their inputs instead of one, such as in the known system. This makes the content of the information transfer between the filters and the processing unit according to the invention twice that in the known system. This increase of information transfer makes it possible, by making use of a proper choice for the filter coefficients in the filters, as well as by choosing an appropriate construction of the processing units at the transmitter and the receiver side, to realize a reconstructed signal at the receiver side that is practically devoid of any distortion because of aliasing. Contrary to the invention, the reconstructed signal in the known system is always subject to aliasing distortion, even for the most optimal construction of the filters and the processing units.

Preferably the coefficients for the analysis filters and synthesis filters are derived from a standard filter having an odd number of coefficients. This leads to a significant reduction in computations in the (other) processing unit, in that, in that case, there is a large symmetry in the coefficients for the (other) processing unit.

Various embodiments of the analysis and synthesis filters are possible.

In one embodiment the system on the transmitter side may be characterized in that each analysis filter comprises a series arrangement of delay sections having equal delay (T), the input of the filter being coupled to the input of the first delay section, outputs of at least a number of odd numbered delay sections in the series arrangement being coupled to corresponding inputs of a first signal combination unit, outputs of least a number of even numbered delay sections in the series arrangement being coupled to corresponding inputs of a second signal combination unit, outputs of the first and second signal combination unit being coupled to the first and second output respectively of the filter. Preferably, the outputs of odd numbered delay sections are coupled to inputs of the first signal combination unit only, and outputs of even numbered delay sections are coupled to inputs of the second signal combination unit only.

In another embodiment, the system may be characterized in that each analysis filter comprises two series arrangements of delay sections having equal delay (2T), the input of the filter being coupled to the inputs of the first and at least a number of other delay sections in each series arrangement, the outputs of the two series arrangements being coupled to the first and second output of the filter respectively; and a further delay section having a delay (T) that equals half the delay of the delay sections in the series arrangements, being coupled in the signal path from the input to the second output of the filter, the further delay section not being included in the signal path from the input to the first output of the filter.

One the receiver side, the system may be characterized in that each synthesis filter comprises two series arrangements of delay sections, having equal delay (2T), the first and second inputs of the filter being coupled to an input of the first delay section of the first and second series arrangement respectively. Outputs of at least a number of delay sections in the first series arrangement are coupled to corresponding inputs of a signal combination unit, and outputs of at least a number of delay sections in the second series arrangement also are coupled to corresponding inputs of the signal combination unit. An output of the signal combination unit is coupled to the filter output. A further delay section, having a delay (T) that equals half the delay of the delay sections in the series arrangements, is coupled in the signal path from the second input to the output of the filter, but the further delay section is not included in the signal path from the first input to the output of the filter.

In another embodiment, the system may be characterized in that each synthesis filter comprises a series arrangement of delay sections having equal delay (T), the first input of the filter being coupled to inputs of at least a number of odd numbered delay sections in the series arrangement, the second input of the filter being coupled to inputs of at least a number of even numbered delay sections in the series arrangement, and the output of the last delay section being coupled to the output of the filter. Preferably, the first filter input is coupled to inputs of odd numbered delay sections only, and the second filter input is coupled to inputs of even numbered delay sections only.

Also various embodiments of the signal processing unit in the transmitter and the other processing unit in the receiver are possible. In one embodiment the signal processing unit comprises M signal combination units, each having an output coupled to a corresponding one of the M outputs of the signal processing unit. For each signal combination unit, at least a number of inputs of the 2M inputs of the processing unit are coupled to corresponding inputs of the signal combination unit, via corresponding multiplication units. The corresponding other signal processing unit on the receiver side then comprises 2M signal combination units, each having an output coupled to a corresponding one of the 2M outputs of the processing unit.

On the transmitter side the system may be further characterized in that the two outputs of each analysis filter are each coupled to their corresponding inputs of the signal processing unit via a corresponding signal amplification unit. Both amplification units are adapted to amplify the signals applied to their inputs by the same complex value, the complex values preferably being different for amplification units coupled to different analysis filters. In addition each output of the processing unit may be coupled to its corresponding output of the coder via a series arrangement of a signal amplification unit and real value determinator, the signal amplification unit being adapted to amplify the signal applied to its input by a complex value.

On the receiver side, the system may be further characterized in that the two outputs of each pair of outputs of the other signal processing unit are each coupled to their corresponding input of a synthesis filter via a corresponding signal amplification unit. Both amplification units are adapted to amplify the signals applied to their inputs by the same complex value, the complex values preferably being different for amplification units coupled to different synthesis filters.

In addition the M inputs of the decoder may be coupled to their corresponding one of the M inputs of the other processing unit via a signal amplification unit, the signal amplification unit being adapted to amplify the signal applied to its input by another complex value.

The invention will be explained further with reference to a number of embodiments in the following figure description.

BRIEF DESCRIPTION OF THE DRAWINGS

FIG. 1 is a block diagram of an embodiment of the transmission system in accordance with the invention, in the form of a block diagram, FIGS. 2a-2i are timings diagrams of the realization of the sample rate increase by means of the first unit, FIG. 10a-10g are partial diagrams of the derivation of the coefficients of the analysis filters in the receiver, FIGS. 14a, 14b and 14c are tables of values of process and filter coefficients derived from a standard filter having an odd number of coefficients, and FIGS. 15a, 15b and 15c are tables of values of process and filter coefficients derived from a standard filter having an even number of coefficients.

DESCRIPTION OF THE PREFERRED EMBODIMENTS

Figure 3:
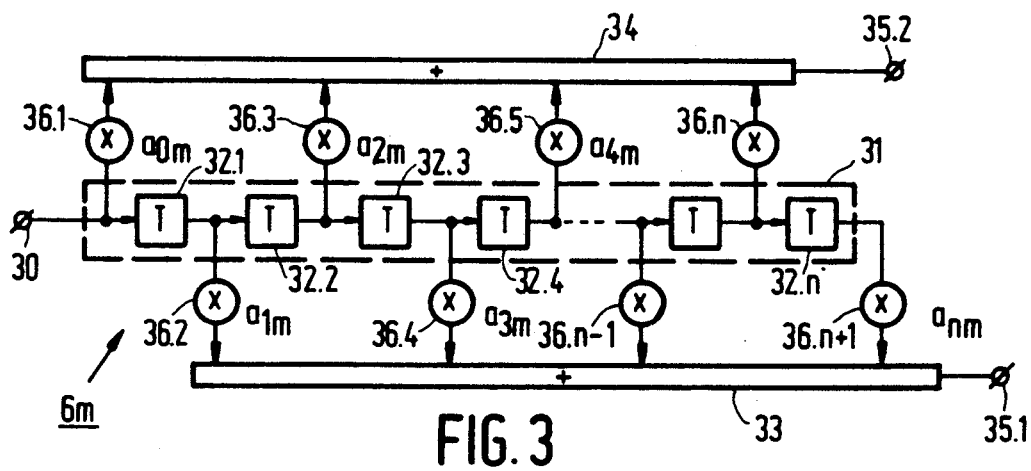
FIGS. 3 and 4 are schematic diagrams of two embodiments of the analysis filter in the system.

FIG. 1 discloses a block diagram of the digital transmission system. The system has an input terminal 1 coupled to an input 2 of a first unit 3, for receiving a digital system IN having a given sampling rate $F_S$. The first unit has M outputs 4.1 to 4.M on which output signals $U_1$ to $U_M$ are available. The first unit 3 is adapted to realize a sample rate decrease by a factor M on the input signal IN applied to its input 2. The functioning of the first unit 3 will be explained later with reference to FIG. 2. M analysis filters 6.1 to 6.M are present, each analysis filter m having an input 5.m (where m runs from 1 to m) coupled to a corresponding one (4.m) of the M outputs of the first unit 3. Each analysis filter 6.m has two outputs 7.ma and 7.mb. Each analysis filter (6.m) is adapted to apply two different filterings on the signal ($U_m$) applied to its input (5.m) and to supply each of the two different filtered versions of that input signal ($U_m$) to a corresponding one of the two outputs (7.ma and 7.mb). The construction and the functioning of the analysis filters will be explained later with reference to the FIGS. 3, 4 and 10. Each one of the 2M filter outputs 7.1a, 7.1b, 7.2a, 7.2b, ..., 7.ma, 7.mb, ..., 7Ma, 7Mb is coupled to a corresponding one of 2M inputs 8.1, 8.2, ..., 8M, 8M+1, ..., 8.2M of a signal processing unit 9. The processing unit 9 has M outputs 10.1 to 10.M. The processing unit 9 is adapted to supply different output signals on each of its M outputs, an output signal being a combination of at least a number of input signals applied to its 2M inputs.

The construction and functioning of the signal processing unit 9 will be explained later with reference to the FIGS. 7 and 8. If the outputs 10.1 to 10.M are identical to the M outputs of the filter means, then this means that the signal processing unit 9 supplies the M subband signals $S_1$ to $S_M$, each subband signal $S_m$ being on a corresponding one (10.m) of the M ouputs of the processing units 9.

The input signal IN applied to the input 1 and having a sampling rate of $F_S$, occupies a bandwidth equal to $F_S/2$. Division of the signal bandwidth by a factor of M means that the bandwidths of the subbands $B_1$ to $B_M$ all equal $F_S/2M$, see FIG. 10c, $s_1$ in FIG. 1 being a down sampled version of the signal present in subband $B_1$, $s_2$ being a down sampled version of the signal present in subband $B_2$, etc.

The M subband signals can, if necessary, further be processed, e.g. in an additional quantizer (not shown), in which an (adaptive) quantization can be applied on the signals in order to realise a significant reduction in bit rate. Examples of such quantizers can e.g. be found in the published European patent application No. 289.080, to which U.S. Pat. No. 4,896,362 corresponds.

The signal processing described above is carried out on the transmitter side of the transmission system. The transmitter in the system thus at least includes the elements with reference numerals 3, 6.1 to 6.M and 9, and, if present, the quantizer.

The signals generated in the transmitter are supplied via a transmission medium, schematically indicated by reference numeral 11 in FIG. 1, to the receiver. This might make the application of a further channel coding of the signal necessary, in order to make an error correction possible at the receiver side. The transmission via the transmission medium 11 can be in the form of a wireless transmission, such as e.g. a radiobroadcast channel. However also other media are very possible. One could think of an optical transmission via optical fibres or optical discs, or a transmission via magnetic record carriers.

The information present in the M subbands can be transmitted in parallel via the transmission medium, such as is disclosed in FIG. 1, or can be transmitted serially. In that case time compression techniques are needed on the transmitter side to convert the parallel data stream into a serial data stream, and corresponding time expansion techniques are needed on the receiver side to reconvert the data stream into a parallel date stream, so that the M subband signals $S_1$ to $S_M$ can be applied to respective ones of the M inputs 12.1 to 12.M of another processing unit 13. The processing unit 13 has 2M outputs 14.1 to 14.2M. The other signal processing unit 13 is adapted to generate an output signal on each of its 2M outputs, an output signal being a combination of at least a number of input signals applied to its M inputs.

The construction and functioning of the other signal processing unit 13 will be explained later with reference to the FIGS. 7 and 9. Pairs of outputs, such as 14.1 and 14.2, of the other processing unit 13 are coupled to pairs of inputs, such as 15.1a and 15.1b, of a corresponding one of M synthesis filters 16.1 to 16.M. Each synthesis filter 16.m has one output 17.m. The synthesis filters apply different filterings on the two signals applied to their two inputs, and supply a combination of the two filtered signals to their output. The construction and functioning of a synthesis filter will be explained later with reference to the FIGS. 5, 6 and 10. The output (17.m) of each synthesis filter (16.m) is coupled to a corresponding one (18.m) of M inputs 18.1 to 18.M of a second unit 19. An output 20 of the second unit is coupled to an output 21 of the transmission system. The functioning of the second unit 19 will be explained later with reference to FIG. 2.

The receiver in the system includes at least the elements with reference numerals 13, 17.1 to 17.M and 19.

If the subband signals have been quantized at the transmitter side, a corresponding dequantizer will be needed in the receiver. Such a dequantizer should be coupled before the other signal processing unit 13. Examples of such dequantizers can also be found in the previously mentioned European patent application No. 289.080 (U.S. Pat. No. 4,896,362). The signal processing at the receiver side needs to be such that signals $u_1$ to $u_m$ are present at the outputs of the synthesis filters 16.1 to 16.M, and that a reconstructed signal OUT is present at the output terminal 21 which, in the ideal case, equals the input signal IN, applied to the input terminal 1.

FIG. 2 discloses the functioning of the first and second units 3 and 19 respectively. The signal IN applied to the input terminal 1 is given schematically in FIG. 2(a) as a function of time.

FIG. 2a discloses the samples from which the input signal IN is built up. It discloses only the location of the samples in time, not the amplitude of the samples. The samples are located a time interval $T_1$, which equals $1/F_S$, apart. The sampling rate of the input signal thus equals $F_S$. In the example of FIG. 2, it is assumed that M equals 8. The signals given in FIGS. 2b to 2i (again only the locations in time, not the amplitudes are given) disclose the signals $U_8$ to $U_1$ present at the outputs 4.1 to 4.8 respectively of the unit 3. The unit 3 acts in fact as a commutator, in that it distributes the eight samples contained each time in consecutive imaginary blocks cyclically to the eight outputs (see also the commutator 3 in FIG. 8).

From FIG. 2 it is clear that the output signals available at the M outputs of the unit 3 have a sampling rate of $F_S/M$. The samples in the output signals are now spaced a time interval T, which equals $M.T_1$, apart.

The reconstruction of the output signal OUT in the second unit 19 will be explained hereafter. The unit 19 can also be considered to be a commutator, in that it cyclically couples each of the M inputs 18.1 to 18.8 with the output 20. In this case, samples occur after each other at the inputs 18.1 to 18.M, in this order, and are applied to the output 20 by the commutator 19. This is shown more clearly by the commutator 19 in FIG. 9.

The first unit can also be built up in a different way, namely by making use of a delay line having tappings at the correct locations along the delay line. These tappings are then coupled to inputs of decimators, that bring the sampling rate down to the correct value.

It is even possible to combine the first unit and the analysis filters, expecially by making use of the delay line in the first unit for (a part of) the delay line(s) in the analysis filters, which is well known in the art.

The same reasoning is in fact valid for the second unit 19. In this case interpolators are needed in order to realise the sample rate increase.

FIG. 3 discloses a first embodiment of an analysis filter 6.m. An input 30 of the analysis filter, which equals the input 5.m in FIG. 1, is coupled to a series arrangement 31 of delay sections, having equal delays T. Outputs of the odd numbered delay sections 32.1, 32.3, ..., 32.n are coupled to inputs of a first signal combination unit 33. Outputs of the even numbered delay sections 32.2, 32.4, ..., are coupled to inputs of a second signal combination unit 34. Outputs of the first and second combination units 33 and 34 form the first and second outputs 35.1 and 35.2 respectively of the analysis filter 6.m. They equal the outputs 7.mb and 7.ma, respectively in FIG. 1. The input 30 of the filter 6.m is coupled to an input of the second signal combination unit 34 via a multiplication unit 36.1. This multiplication unit multiplies the signals (samples) applied to its input by a factor of $a_{om}$. The outputs of the odd numbered delay sections are coupled to the inputs of the signal combination unit 33 via multiplication units 36.2, 36.4, ..., 36.n−1 and 36.n+1. They multiply the signals (samples) applied to their respective units by respective factors of $a_{1m}, a_{3m}, ..., a_{nm}$. The outputs of the even numbered delay sections are coupled to the inputs of the signal combination unit 34 via multiplication units 36.3, 36.5, ..., 36.n. They multiply the signals (samples) applied to their respective inputs by respective factors of $a_{2m}, a_{4m}, ....$ In a more general definition of the signal combination units, these multiplication units can be considered as being included in the signal combination units. In that case, the signal combination units not only realize a summation of the signals applied to their inputs, but they realize a weighted combination (summation) of these signals. It is evident that, in the case that a multiplication unit has a factor $a_{im}$ that equals zero, the coupling from the delay section to the signal combination unit including the multiplication unit is dispensed with. It is further evident that, in the case that the multiplication unit has a factor $a_{im}$ that equals one, the multiplication unit is dispensed with, so that the coupling is a direct coupling.

Figure 4:
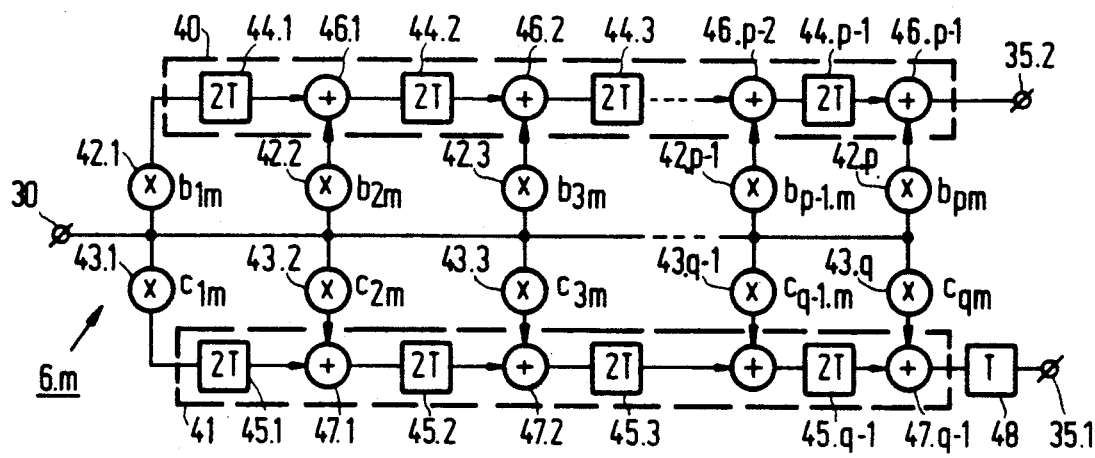

FIG. 4 shows another embodiment for the analysis filter 6.m. Although the circuit construction of the filter in FIG. 4 is different from the circuit construction of the filter of FIG. 3, it can carry out the same functioning and the same filterings, when some conditions are met. The filter of FIG. 4 includes two series arrangements 40 and 41 of delay sections having equal delay (2T). The input 30 of the filter is coupled to inputs of the delay sections in the series arrangement 40 via multiplication units 42.1 to 42.p−1 respectively and with the output 35.2 of the filter via a multiplication unit 42.p. That means that the series arrangement 40 includes p−1 delay sections 44.1 to 44.p−1. The input 30 of the filter is further coupled to inputs of the delay sections in the series arrangement 41 via multiplication units 4.1 to 43.q−1, and further with the output 35.1 of the filter via a multiplication unit 43.q. That means that the series arrangement 41 includes q−1 delay sections 45.1 to 45.q−1. The multiplication units 42.1 to 42.p multiply their input signals by a factor $b_{1m}, b_{2m}, ..., b_{pm}$ respectively. The multiplication units 43.1 to 43.q multiply their input signals by a factor $c_{1m}, ..., c_{qm}$ respectively. Signal combination units 46.1 to 46.p−1 are coupled to the outputs of the delay sections 44.1 to 44.p−1 of the series arrangement 40. Signal combination units 47.1 to 47.q−1 are coupled to the outputs of the delay sections 45.1 to 45.q−1 of the series arrangement 41. The output of the combination unit 47.q−1 is coupled to the filter output 35.1 via an additional delay section 48 having a delay T that equals half the delays of the delay sections in the series arrangements. The delay section 48 could have been provided somewhere else in the signal path from the input 30 to the output 35.1, provided that this delay section is not included in the signal path from the input 30 to the output 35.2.

What has been said with reference to FIG. 3 in the case that a multiplication unit has a multiplication factor that equals one or zero, is of course also valid in this case. In the latter case, let us assume that $b_{2m}$ would be zero, this also means that the corresponding signal combination unit 46.1 that would otherwise have been coupled to the output of the relevant multiplication unit 42.2 can also be dispensed with. This means that the delay section 44.1 is directly connected to the delay section 44.2, or they can be combined into a delay section having a delay of 4T.

Under certain conditions the filter of FIG. 4 functions the same and realizes the same filterings on the input signal, as the filter of FIG. 3. The conditions for this are:

$p = q = (n+1)/2$, $b_{pm} = a_{om}$, $c_{qm} = a_{1m}$, $b_{p-1.m} = a_{2m}$, $c_{q-1.m} = a_{3m}$, ..., $b_{1m} = a_{n-1.m}$ and $c_{1m} = a_{nm}$.

In this case, it is assumed that n is an odd number. If, however n is an even number, the number of couplings to the combination unit 34 in FIG. 3 is one larger than the number of couplings to the combination unit 33. In that case the conditions are as follows:

$q = p - 1 = n/2$, $b_{pm} = a_{om}$, $c_{qm} = a_{1m}$, $b_{p-1.m} = a_{2m}$,
$c_{q-1.m} = a_{3m}, \ldots, b_{1m} = a_{nm}$ and $c_{1m} = a_{n-1.m}$.

Please note that the coupling including the multiplication unit 36.n+1 in the filter of FIG. 3, where n is even, is a coupling from the output of the series arrangement 31 to the signal combination unit 34!

Figure 5:
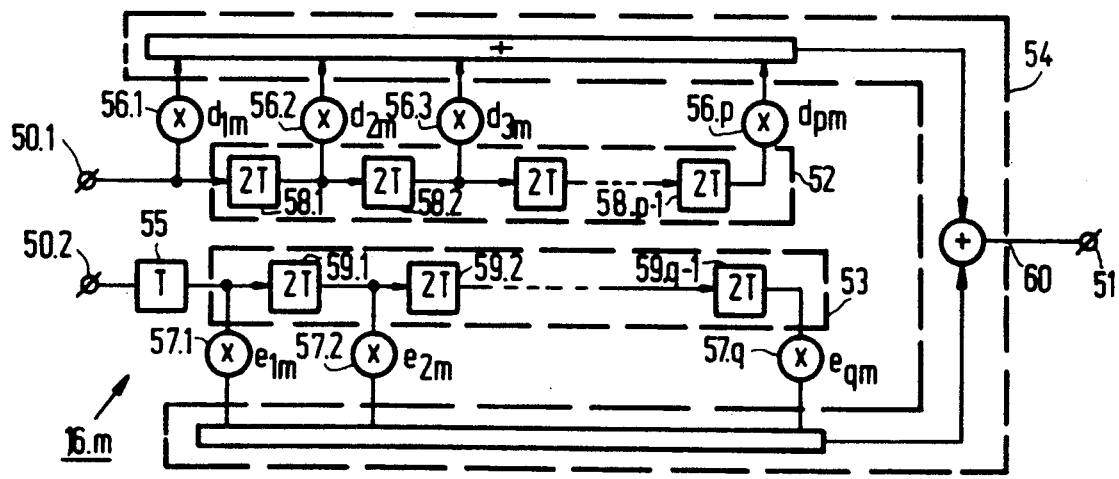
FIGS. 5 and 6 are similar diagrams of two embodiments of the synthesis filter in the system.

FIG. 5 shows a synthesis filter 16.m having two inputs 50.1 and 50.2 and one output 51. The inputs equal the inputs 15.ma and 15.mb and the output equals the output 17.m in FIG. 1. The synthesis filter includes two series arrangements 52 and 53 of delay sections having equal delay 2T. The filter 16.m further includes a signal combination unit 54 and an additional delay section 55 having a delay T that equals half the delay of the delay sections in the arrangements. The inputs 50.1 and 50.2 are coupled to inputs of the signal combination unit 54 via multiplication units 56.1 and 57.1 respectively. The series arrangement 52 includes p−1 delay sections 58.1 to 58.p−1. Outputs of these delay sections are coupled to corresponding inputs of the combination unit 54 via corresponding multiplication units 56.2 to 56.p. The multiplication units 56.1 to 56.p multiply their input signals by a factor of $d_{1m}$ to $d_{pm}$ respectively. The series arrangement 53 includes q−1 delay sections 59.1 to 59.q−1. Outputs of these delay sections are coupled to corresponding inputs of the combination unit 54 via corresponding multiplication units 57.2 to 57.q. The multiplication units 57.1 to 57.q multiply their input signals by a factor of $e_{1m}$ to $e_{qm}$ respectively. The output 60 of the combination unit 54 is coupled to the filter output 51. The delay section 55 is included between the input 50.2 and the input of the series arrangement 53. More generally, the delay section 55 can be included somewhere in the signal path from the input 50.2 to the output 51 such that it is not included in the signal path from the input 50.1 to the output 51.

For the filter 16.m to apply the correct filterings at the receiver side on the two signals applied to the inputs 50.1 and 50.2, when the m-th filter on the transmitter side is the filter 6.m of FIG. 3, the following condition should be met:

$p = q = (n+1)/2$, $d_{1m} = a_{om}$, $e_{1m} = a_{1m}$, $d_{2m} = a_{2m}$,
$e_{2m} = a_{3m}, \ldots$, $d_{pm} = a_{n-1.m}$ and $e_{qm} = a_{nm}$. Again it is assumed that n is an odd number. In the same way as explained previously it can be found that when n is an even number, the conditions are as follows:

$q = p - 1 = n/2$, $d_{1m} = a_{om}$, $e_{1m} = a_{1m}$, $d_{2m} = a_{2m}$,
$e_{2m} = a_{3m}, \ldots, e_{qm} = a_{n-1.m}$ and $d_{pm} = a_{n.m}$.

Figure 6:
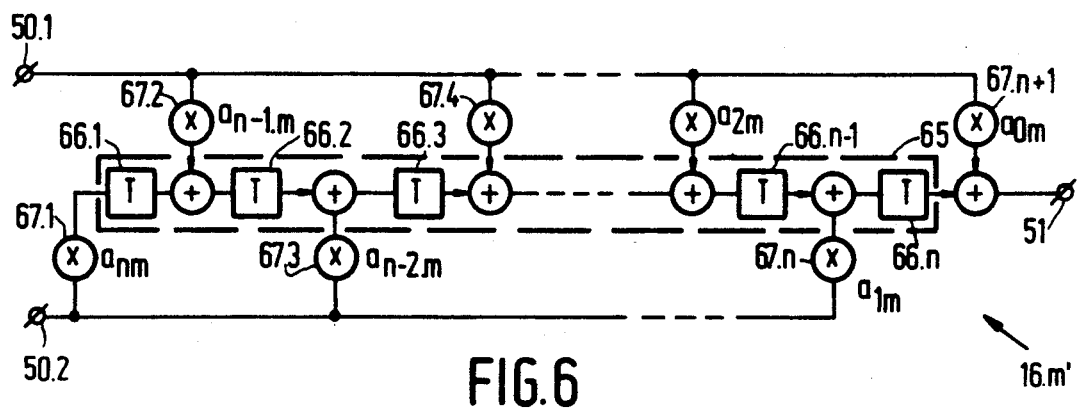

FIG. 6 shows another embodiment of the synthesis filter 16.m, denoted by 16.m'. The filter includes a series arrangement 65 of delay sections 66.1 to 66.n, having equal delay T. The input 50.1 is coupled to inputs of even numbered delay sections, via multiplication units 67.2, 67.4, ..., 67.n+1. n is thus considered to be an odd number. The input 50.2 is coupled to inputs of odd numbered delay sections via multiplication units 67.1, 67.3, ..., 67.n. In order for the filter 16.m' to carry out the correct filterings at the receiver side on the signals applied to the inputs 50.1 to 50.2, when the m-th filter on the transmitter side is the filter 6m of FIG. 3, the coefficients with which the multiplication units 67.1 to 67.n+1 multiply their input signals should be as given in FIG. 6. These coefficients thus equal $a_{nm}$, $a_{n-1.m}$, ..., $a_{2m}$, $a_{1m}$, $a_{om}$ respectively.

The choice for the coefficients $a_{om}$ to $a_{nm}$ for the filter 6.m of FIG. 3 will be further explained with reference to FIG. 10.

FIG. 10(c) shows the filterband of the digital signal, which is $F_S/2$ Hz broad. The total filterband is divided into M subbands $B_1$ to $B_M$ of equal bandwidth $F_S/2M$. FIG. 10(a) shows an imaginary or standard low pass filter having a filter characteristic of H(f) and a bandwidth $F_B$ equal to half the bandwidth of the subbands. FIG. 10(b) shows the impulse response of the low pass filter H(f) as a function of time. This impulse response is in the form of an array of impulses at equidistant time intervals $T_1 = 1/F_s$ spaced apart. The impulse response is characterized by an array of values $h_0$, $h_1$, $h_2$, ... indicating the amplitude of the impulses at the time intervals $t = 0$, $T_1$, $2T_1$, ....

FIGS. 10(d) to (g) show how the multiplication factors for the multiplication units in the filters 6.1 to 6.M can be obtained using the impulse response of the standard low pass filter H(f). As can be seen the factors $a_{01}$ to $a_{oM}$, being the multiplication factors for the multiplication units 36.1 in the filters 6.1 to 6.M, see FIG. 3, equal $h_0$ to $h_{M-1}$ respectively. The factors $a_{11}$ to $a_{1M}$, being the multiplication factors for the multiplication units 36.2 in the filters 6.1 to 6.M, see FIG. 3, equal $h_M$ to $h_{2M-1}$ respectively, the factors $a_{21}$ to $a_{2M}$ equal $-h_{2M}$ to $-h_{3M-1}$ respectively, the factors $a_{31}$ to $a_{3M}$ equal $-h_{3M}$ to $-h_{4M-1}$ respectively and so on, see especially the filter in FIG. 10d, which filter is worked out a little bit further. Preferably, the standard filter H(f) has an odd number of impulses. This means that the filter has an odd number of coefficients $h_0$, $h_1$, $h_2$, .... The advantage of this will be made clear later.

Figure 7:
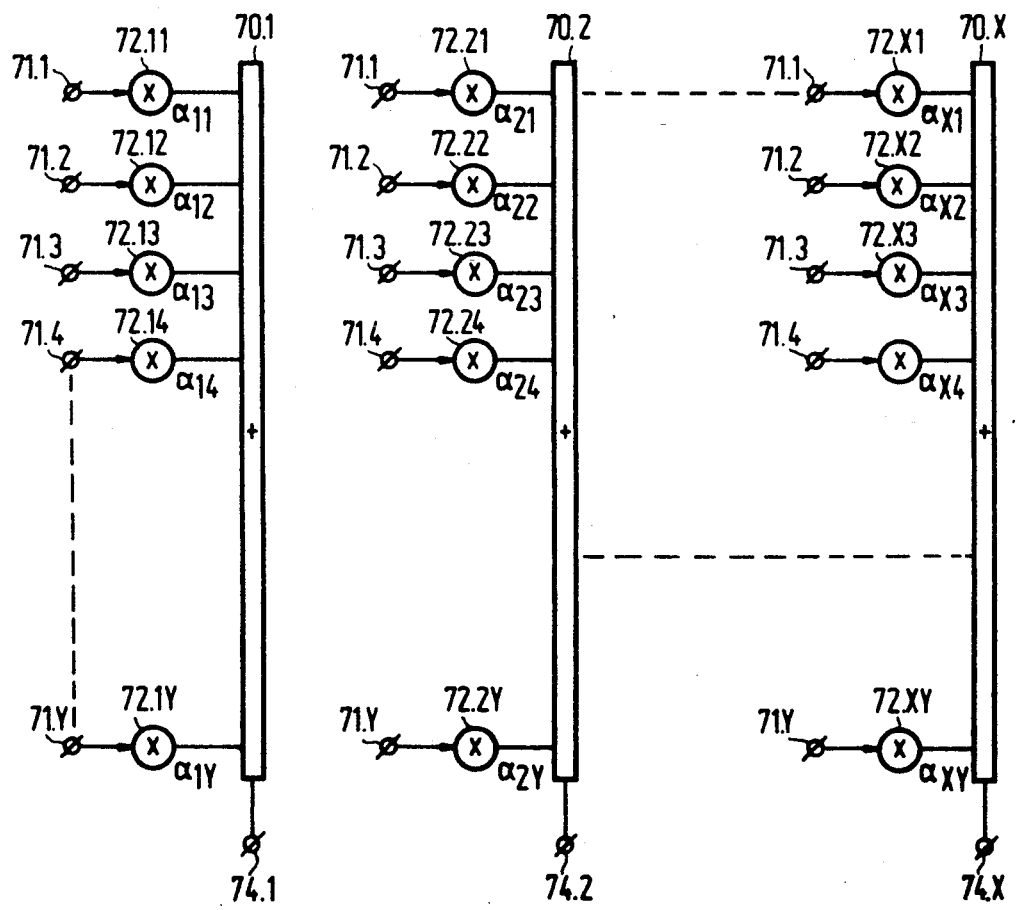
FIG. 7 is a similar diagram of embodiment of the signal processing unit in the transmitter or the other signal processing unit in the receiver.

FIG. 7 shows an embodiment of the processing unit 9. The processing unit 9 includes X signal combination units 70.1 to 70.X. Y inputs, 71.1 to 71.Y, of the signal processing unit 9 are coupled via corresponding multiplication units 72.11 to 72.1Y to corresponding inputs of the combination unit 70.1. The Y inputs of the processing unit are also coupled to inputs of the combination unit 70.2, via corresponding multiplication units 72.21 to 72.2Y. This goes on for all the other combination units 70.x, where x runs from 1 to X inclusive. This means that the y-th input 71.y is coupled to a corresponding input of the x-th combination unit 70.x via a corresponding multiplication unit 72.xy, where y runs from 1 to Y. It will be clear that Y equals 2M and the X equals M. The inputs 71.1 to 71.2M correspond in that order with the inputs 8.1 to 8.2M in FIG. 1. The outputs 74.1 to 74.M in that order correspond with the outputs 10.1 to 10.M in FIG. 1. The multiplication units 72.11 to 72.1Y, 72.21 to 72.2Y, 72.31 to 72.3Y, ... 72.X1 to 72.XY multiply their input signals by a factor of $a_{11}$ to $a_{1Y}$, $a_{21}$ to $a_{2Y}$, $a_{31}$ to $a_{3Y}$, ..., $a_{X1}$ to $a_{XY}$ respectively. The factors $a_{xy}$ can be calculated, using the following formula:

$$a_{xy} = \begin{cases} \cos \Psi & \text{for } y \text{ being an odd number} \\ \sin \Psi & \text{for } y \text{ being an even number} \end{cases}$$

with $$\Psi = (-1)^{x-1}\pi(x-\tfrac{1}{2})\{\tfrac{1}{2}-(y-1)/DIV2/M\}$$

In the foregoing it is assumed that the impulse response of the standard filter H(f) in FIG. 10b has an odd number of impulses, and thus an odd number of coefficients.

FIG. 7 will also be used for explaining the construction and functioning of the other processing unit 13 on the receiver side. In that case, Y equals M and X equals 2M. In this case the inputs 71.1 to 71.M, in that order, correspond to the inputs 12.1 to 12.M in FIG. 1; and the outputs 74.1 to 74.2M, in that order, correspond to the outputs 14.1 to 14.2M in FIG. 1. The factors $a_{xy}$ for the processing unit 13 can be calculated, using the following formula:

$$a_{xy} = \begin{cases} \sin \Psi' & \text{for } x \text{ being an odd number} \\ -\cos \Psi' & \text{for } x \text{ being an even number} \end{cases}$$

with $$\Psi' = (-1)^{y-1}\pi(y-\tfrac{1}{2})\{\tfrac{1}{2}-(x-1)DIV2/M\}$$

for an odd number of coefficients in the impulse response of H(f) in FIG. 10b.

By using these coefficients $a_{xy}$ in the processing units on the transmitter and the receiver side, one realizes a transmission system that is practically fully devoid of any aliasing distortion. This in fact also requires bandwidth constraints imposed on the frequency transfer function of the standard filter. Preferably, the transition bandwidth of the filter should not exceed Fs/4M. A numerical example is given in table shown in FIG. 14a for the coefficients for the processing unit 9 and in table shown in FIG. 14b for the coefficients for the other processing unit 13, where M has been taken equal to 8, with the assumption that the impulse response H(f) in FIG. 10b has an odd number of coefficients. The table shown in FIG. 14c includes the corresponding filter coefficients for the eight analysis filters 6.m. The coefficients for the corresponding synthesis filters 16.m can be derived from the coefficients in FIG. 14c, in the way as explained with reference to FIGS. 5 and 6. Further the tables shown in FIGS. 15a and 15b give the coefficients $a_{xy}$ for the processing unit 9 and the other processing unit 13; and the table shown in FIG. 15c the multiplication factors $a_{nm}$ for the eight analysis filters 6.m, in the case that the impulse response of the standard filter H(f) includes an even number of coefficients. From FIGS. 14a and 14b, for the situation where the standard filter has an odd number of coefficients, it is clear that there is a large symmetry in the coefficients for the processing units. A large number of coefficients in one table is equal to each other, or differ only by its sign. This makes a large reduction in multiplying capacity possible. This reduction is contrary to the tables FIGS. 15a and 15b, for the situation where the standard filter has an even number of coefficients. Here the coefficients differ much more from each other. As already explained, the table of FIG. 14c includes the filter coefficients derived from a standard filter having an odd number of impulses in the impulse response function. This is a filter that generates 127 impulses upon application of one input impulse, and which filter includes 127 filter-coefficients. The table however includes 128 coefficients. This has been realized by adding one zero as the first coefficient $h_0$, see the value for $a_{0.1}$ in FIG. 14c. The table of FIG. 15c has been obtained from a standard filter having an even number of (128) coefficients. In both cases, the impulse responses of the standard filter are symmetrical. That means that two coefficients lying symmetrically around the middle are equal, except for their signs. This middle is for the odd numbered case at the location in time of the impulse $h_{64}$. This means that $h_1 (=a_{0.2})$ equals $h_{127} (=a_{16.8})$, $h_2 (=a_{0.3})$ equals $h_{126} (=a_{16.7})$, $h_3 (=a_{0.4})$ equals $h_{125} (=a_{16.6})$, $h_4 (=a_{0.5})$ equals $h_{124} (=a_{16.5})$, $h_5 (=a_{0.6})$ equals $h_{123} (=a_{16.4})$, $h_6 (=a_{0.7})$ equals $h_{122} (=a_{16.3})$, $h_7 (=a_{0.8})$ equals $h_{121} (=a_{16.2})$, $h_8 (=a_{1.1})$ equals $h_{120} (=a_{16.1})$, $h_9 (=a_{1.2})$ equals $h_{119} (=a_{15.8})$ and so on. All are equalities except for their signs. $h_{64}$, which is $a_{8.1}$, stands alone, see FIG. 14c. The middle for the even numbered case is at a location exactly halfway between $h_{63}$ and $h_{64}$.

This means that $h_0 (=a_{0.1})$ equals $h_{127} (=a_{16.8})$, $h_1 (=a_{0.2})$ equals $h_{126} (=a_{16.7})$, $h_2 (=a_{0.3})$ equals $h_{125} (=a_{16.6})$, $h_3 (=a_{0.4})$ equals $h_{124} (=a_{16.5})$, $h_4 (=a_{0.5})$ equals $h_{123} (=a_{16.4})$, $h_5 (=a_{0.6})$ equals $h_{122} (=a_{16.3})$, $h_6 (=a_{0.7})$ equals $h_{121} (=a_{16.2})$, $h_7 (=a_{0.8})$ equals $h_{120} (=a_{16.1})$, $h_8 (=a_{1.1})$, equals $h_{119} (=a_{15.8})$, ... and so on ... until $h_{63} (=a_{7.8})$ equals $h_{64} (=a_{8.1})$. All are equalities except for their signs.

If there is a greater discrepancy than one, as explained above for the standard filter with an odd number of coefficients, between the number of coefficients in the standard filter and the coefficients $a$ needed for the analysis (and synthesis) filters, then zeros should be added symmetrically starting from the outside and going to the inside. So, if the standard filter has 126 coefficients then $a_{0.1}$ as well as $a_{16.8}$ are zero.

Figure 8:
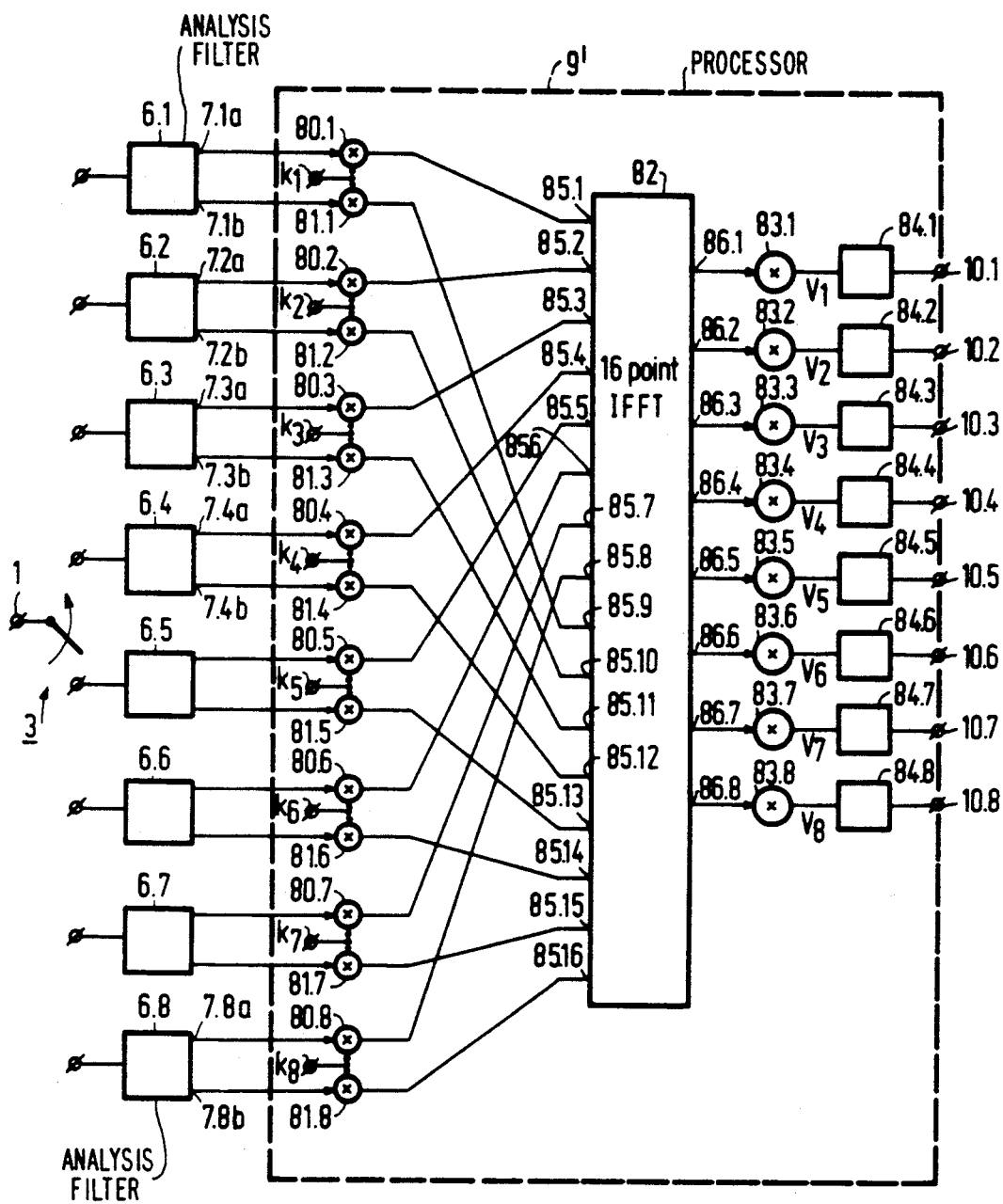
FIG. 8 is a block diagram of another embodiment of the transmitter in the system.

FIG. 8 shows an embodiment of the transmitter, which divides the input signal into eight subband signals. The output 7.1a and 7.1b of the analysis filter 6.1 are coupled to inputs of a corresponding amplification unit 80.1 and 81.1 respectively. The amplification units 80.1 and 81.1 amplify their input signals with a complex factor $k_1$ that is the same for both units 80.1 and 81.1. The outputs of these units 80.1 and 81.1 are coupled to inputs 85.1 and 85.9 respectively of a processing unit 82. The outputs 7.2a and 7.2b of the filter 6.2 are coupled to inputs of a corresponding amplification unit 80.2 and 81.2 respectively. They both amplify their input signals with a complex factor $k_2$. The outputs of these units are coupled to inputs 85.2 and 85.10 of the processing unit 82. In the same way, all the other filter outputs are coupled via corresponding amplification units 80.3, 81.3, ..., 80.8, 81.8 to inputs 85.3, 85.11, 85.4, 85.12, ..., 85.8, 85.16 of the processing unit 82. Amplification units coupled to outputs of the same filter 6.m multiply their input signals with the same complex value $k_m$. The complex values $k_m$ equal the following formula:

$$k_m = \exp[j(m-1)\pi/2M]$$

The processing unit 82 carries out a 2M(=16) point IFFT (Inverse Fast Fourier Transform) on the sixteen input signals applied to the inputs 85.1 to 85.16. The construction of such a processing unit is generally known from textbooks on digital signal processing, such as the book "Discrete-time signal processing: an introduction" by A. W. M. van den Enden and N. A. M. Verhoeckx, Prentice Hall, see especially Chapter 5.7, pages 143-151. A 16-point IFFT has sixteen outputs. Only the first M(=8) outputs will be used. These outputs are generally associated with the low frequency outputs of block 82. These outputs 86.1 to 86.8 are each coupled via a corresponding amplification unit 83.1 to 83.8 respectively and a real value determining device 84.1 to 84.8 respectively to the terminals 10.1 to 10.8 respectively that are coupled to the transmission medium 11. The amplification units 83.1 to 83.8 amplify their input signals by a complex value $V_1$ to $V_8$ respectively. The complex value $V_m$ equal the following formula:

$$V_m = \exp j\beta_m$$

where $\beta_m$ needs to be chosen properly and should be chosen such that the behaviour of the circuit within the dashed block denoted by 9' equals the behaviour of the circuit as described with reference to FIG. 7 and FIG. 14a or 15a. The advantage of the processing unit of FIG. 8 is that it can realize the functioning as explained with reference to FIG. 7 for an even as well as odd number of coefficients of H(f). In that case, only the values $\beta_m$ need to be chosen differently. In general the complex values differ from each other for different values of m.

Figure 9:
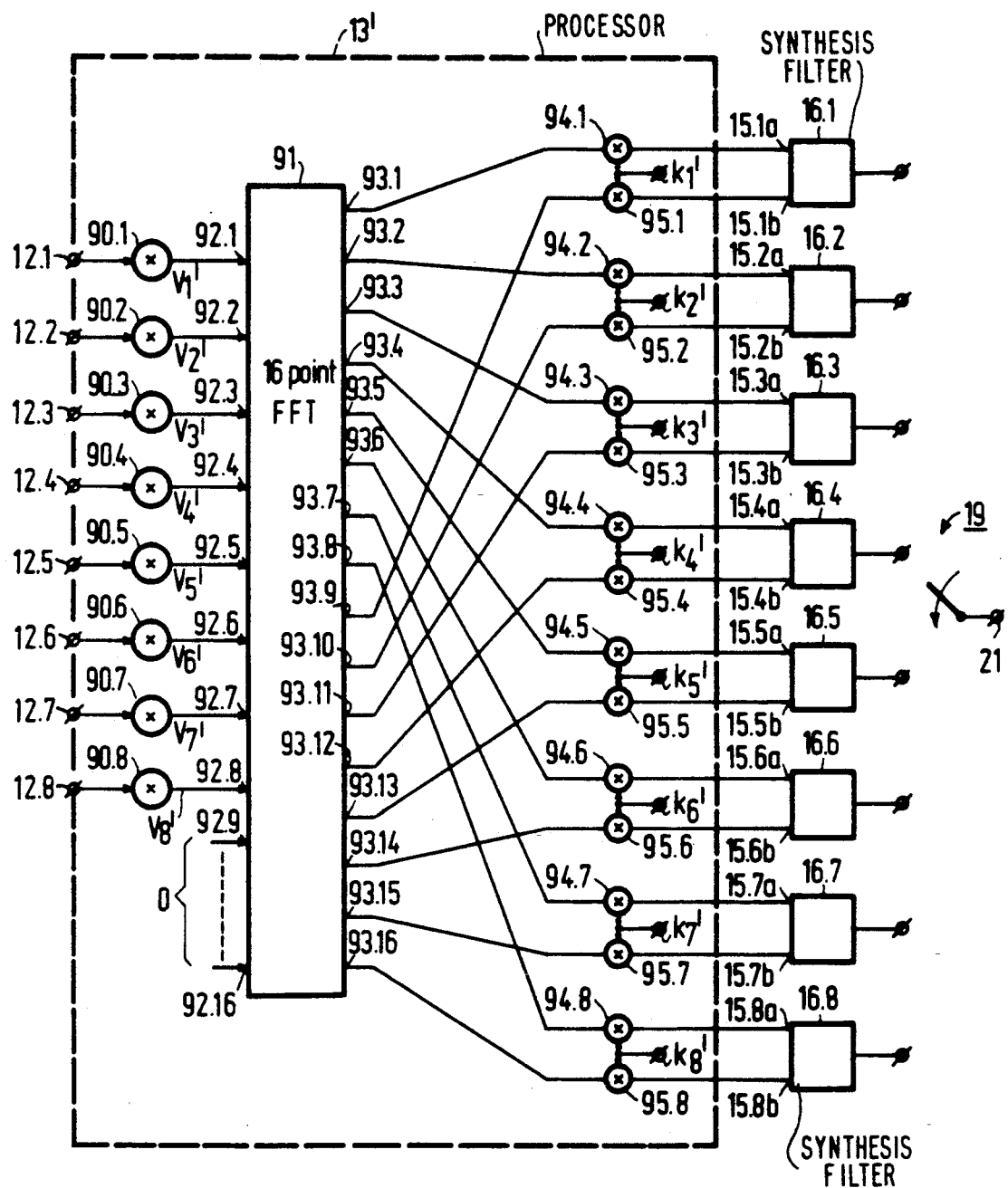
FIG. 9 is a block diagram of another embodiment of the receiver in the system.

FIG. 9 shows an embodiment of the receiver that can cooperate with the transmitter of FIG. 8. The terminals 12.1 to 12.8 are coupled to the first M(=8) inputs 92.1 to 92.8 respectively of a processing unit 91 via corresponding amplification units 90.1 to 90.8 respectively. These amplification units amplify their input signals by a factor of $V_1'$ to $V_8'$ respectively. The processing unit 91 carries out a 2M(=16) point FFT. Constructions of such units can also be found in the previously mentioned book of Van den Enden et al. Such units have 16 inputs. This means that a value of zero will be applied to the second M(=8) inputs 92.9 to 92.16 of the processing unit 91. Pairs of two outputs 93.1 and 93.9, 93.2 and 93.10, . . . , 93.8 and 93.16 are coupled to the two inputs of corresponding filters 16.1, 16.2, . . . , 16.8 via corresponding amplification units 94.1 and 95.1 respectively, 94.2 and 95.2 respectively, . . . , 94.8 and 95.8 respectively. Amplification units 94.m and 95.m amplify their input signals by equal complex values of $k_m'$.

The complex values $k_m'$ equal the following formula:

$$k_m' = \exp[-j(m-1)/2M]$$

The complex values $V_m'$ equal the following formula:

$$V_m' = (\exp(-j\beta_m')$$

where $\beta_m'$ needs to be chosen properly and should be chosen such that the behaviour of the circuit within the block 13' indicated by dashed lines equals the behaviour of the circuit as described with reference to FIG. 7 and FIG. 14b or 15b. The advantage of the other processing unit of FIG. 9 is that it can also realize the functioning as explained with reference to FIG. 7 for an even as well as an odd number of coefficients for H(f). In that case, only the values $\beta_m'$ need to be chosen differently.

Figure 11:
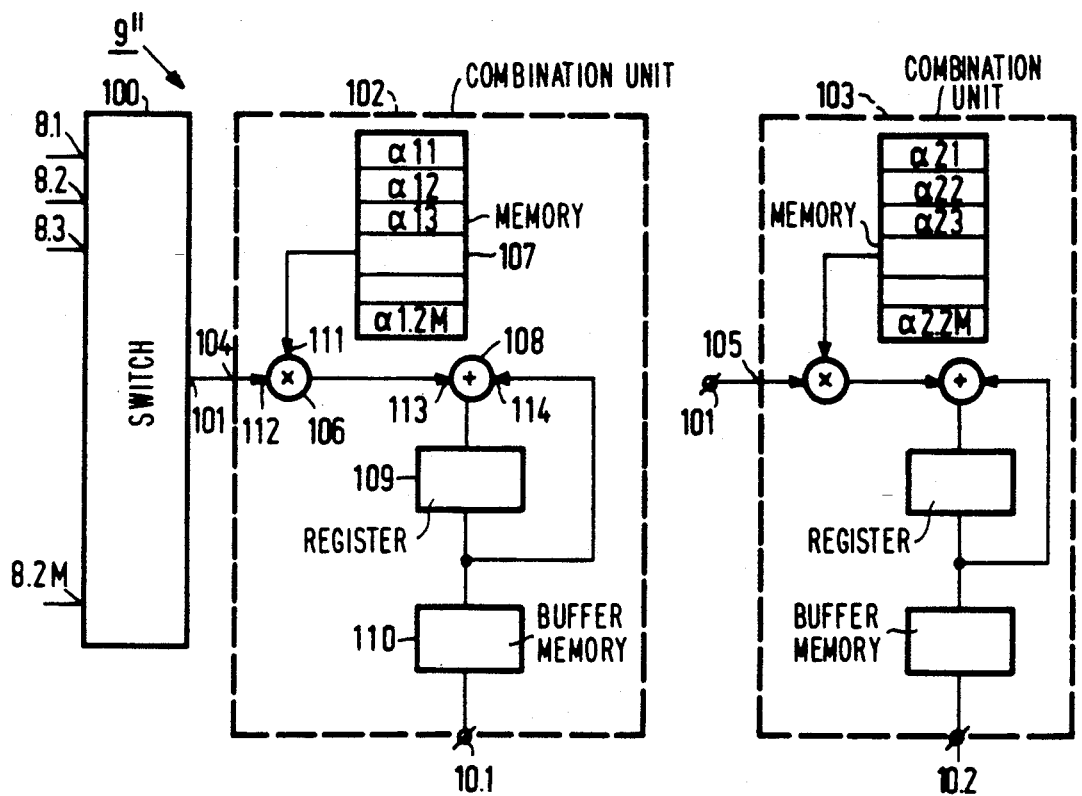
FIG. 11 is a block diagram of another example of the processing unit in the transmitter, or the other signal processing unit in the receiver.

FIG. 11 shows again another embodiment of the signal processing unit 9 of FIG. 1, denoted by 9''. The processing unit 9'' has switching means 100, and M signal combination units, of which only the first two are shown and have the reference numberals 102 and 103, respectively. The inputs 8.1 to 8.2M of the processing unit 9'' are coupled to the 2M inputs of the switching means 100. These means 100 have one output 101 which is coupled to the inputs of all signal combination units. Only the couplings to the inputs 104 and 105 of the combination units 102 and 103 are given. The outputs of the M combination units are the outputs 10.1 to 10.M of the processing unit 9''. Each combination unit has a multiplication unit 106, a memory 107 having 2M storage locations, an adder 108 and an accumulating register 109.

The switching means 100 are adapted to arrange each time, in a serial fashion at the output 101, the samples in blocks of 2M samples that occurred more or less at the same instant at the 2M inputs 8.1 to 8.2M, each sample at one input. The contents of the memory 107 for the combination unit 102 and 103 are given in FIG. 11. The multiplication factors $a_{11}$, to $a_{1.2M}$ and $a_{21}$ to $a_{2.2M}$ contained in the memories equal the corresponding factors in the processing unit 9 in FIG. 7. The processing unit 9 and 9'' should of course carry out the same processing on the signals applied to their inputs. The memory 107 is controlled in such a way that it supplies the factor $a_{11}$ to the input 111 of the multiplication unit 106, when the switching means 100 supplies the sample that occurred at the input 8.1 to the input 112 of the unit 106. The contents of the register 109 is zero at this moment, so that after the multiplication the result is stored in the register 109. Next, the sample that occurred at the input 82 is applied to the input 112 and the factor $a_{12}$ is applied to the input 111 of the unit 106, and they are multiplied with each other.

By means of the adder 108, the result of this multiplication, that is applied to the input 113 of adder 108, is added to the contents of the register 109, that is applied to the input 114 of the adder 108, and stored in the register 109.

This processing continues for the multiplication with all the 2M factors contained in the memory 107. Moreover this processing is carried out in parallel in the other combination units, such as unit 103.

After the 2M-th multiplication, the result of this multiplication is added to the contents in the register. The contents then obtained are supplied to the output 10.1, by storing them in an additional buffer memory 110. Next, the contents of the register 109 are set to zero and a next cycle of 2M multiplications can begin. It is evident that the other processing unit 12 can be built up in the same way. Such a processing unit comprises 2M signal combination units, such as the unit 102 in FIG. 11, with the difference that the memory 107 now contains M factors $a_{11}$ to $a_{1.M}$ or $a_{21}$ to $a_{2.M}$ for the memory 107 in the unit 103. Further the switching means 100 are different, in that they have M inputs 12.1 to 12.M and that they arrange each time, in a serial fashion at the output 101, the samples in consecutive blocks of M samples that occurred more or less at the same instant at the M inputs 12.1 to 12.M, each sample at one input. Further the register 109 is now set to zero after the M-th multiplication.

Figure 12:
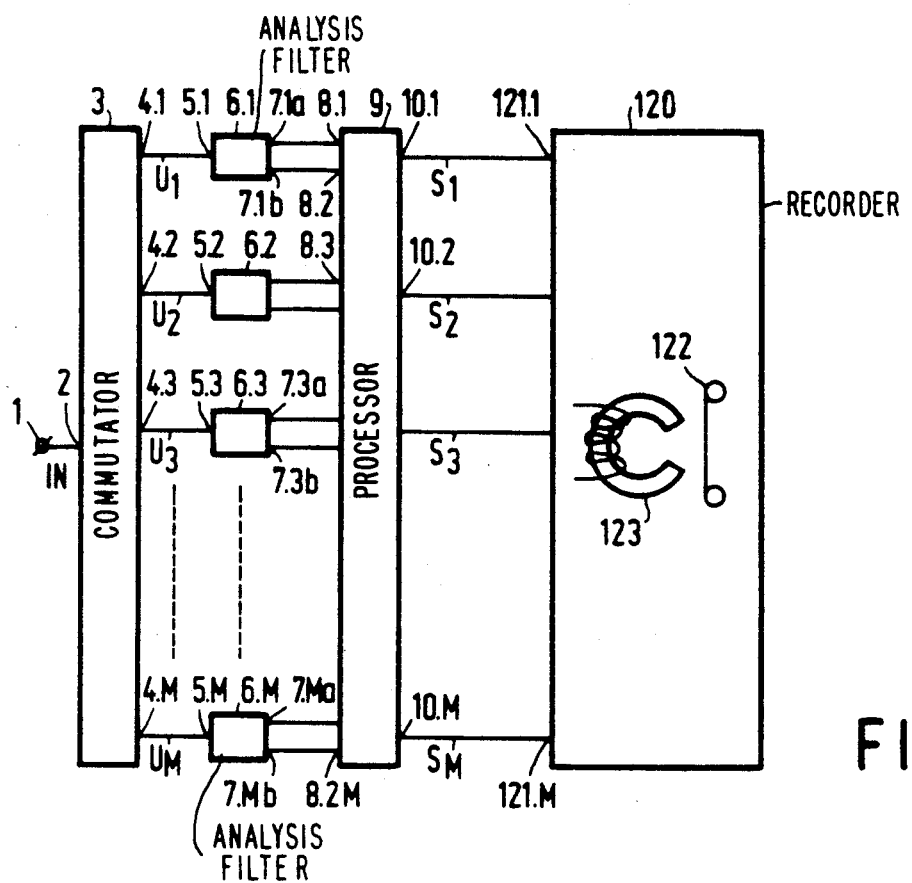
FIG. 12 is a block diagram a digital signal recording apparatus.
Figure 13:
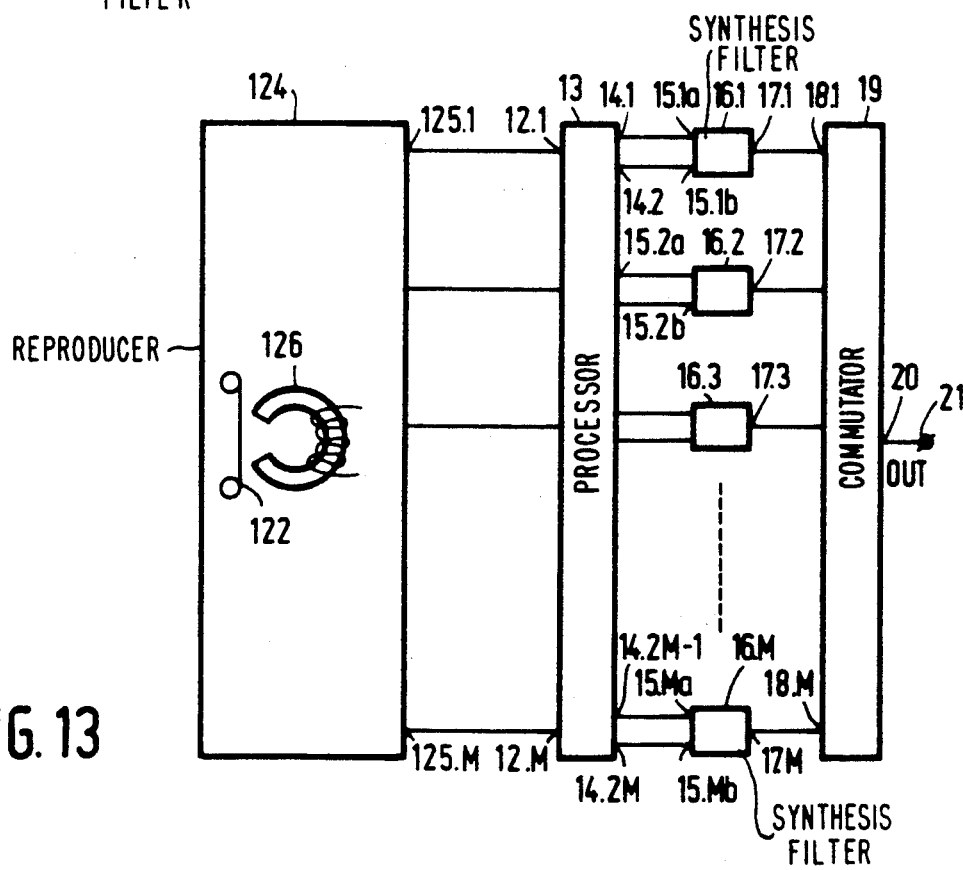
FIG. 13 is a block diagram a digital signal reproduction apparatus.

FIGS. 12 and 13 show transmission via magnetic record carriers. FIG. 12 shows a digital signal recording apparatus, which includes the transmitter as shown in FIG. 1. The apparatus further includes recording means 120 having M inputs 121.1 to 121.M, each one coupled to a corresponding one of the M outputs of the signal processing unit 9. The apparatus is for recording a digital audiosignal to be applied to the input 1 on a magnetic record carrier 122 by means of at least one magnetic recording head 123.

The recording means 120 can be an RDAT type of recording means, which uses the helical scan recording principle to record the signal $s_1$ to $s_M$ in slant tracks lying next to each other on the record carrier, in the form of a magnetic tape. In that case it might be necessary for the recording means 120 to incorporate means to realize a parallel-to-serial conversion on the signal applied to the inputs 121.1 to 121.M.

The recording means 120 can equally well be an SDAT type of recording means, in which the signals $s_1$ to $s_m$ to be recorded are divided over a number of tracks, the number of tracks not necessarily being equal to M, lying in parallel on, and in the length direction of the record carrier. Also in this case it might be necessary to realize parallel-to-serial conversion on the signals, e.g. if the number of tracks is less than M.

RDAT and SDAT type of recording means are well known in the art and can, for example, be found in the book "The art of digital audio" by J. Watkinson, Focal press, London, 1988. Therefore no further explanation is needed.

FIG. 13 shows a digital reproduction apparatus, which includes the receiver as shown in FIG. 1. The apparatus further includes reproducing means 124 having M outputs 125.1 to 125.M, each one coupled to one of the inputs 12.1 to 12.M of the other signal processing unit 13.

The apparatus is for reproducing the digital signal, as it is recorded on the record carrier 122 by means of the apparatus of FIG. 12. Therefore the reproducing means 124 comprise at least one read head 126. The reproducing means can be an RDAT or SDAT type reproducing means. For a further explanation of the reproducing means in the form of an RDAt or SDAT type reproducing means, reference is made to the previously mentioned books of J. Watkinson.

It should be noted that the invention is not limited to the embodiments disclosed herein. The invention equally applies to those embodiments which differ from the embodiments shown, in respect which are not relevant to the invention. As an example, the present invention can be equally well applied in apparatuses as described in the not yet published Netherlands Patent applications 88.02.769 and 89.01.032, to which U.S. patent application Ser. No. 07/433,631 corresponds, in which at least two signals are combined into a composite signal, are transmitted, and are split up in at least two signals at the receiver side.

We claim:

1. A digital transmission system including a transmitter and a receiver, said transmitter including a coder and said receiver including a decoder for subband coding of a digital signal having a sampling rate $F_S$ in a signal band, said coder comprising means for generating a number M of subband signals with sampling rate reduction, and means for dividing the signal band into successive subbands identified by band numbers m increasing with frequency, where $1 \leq m \leq M$, said decoder comprising means for merging said subbands to said signal band with sampling rate increase, and for constructing a replica of said digital signal from said M subband signals, characterized in that said coder comprises a coder processor having 2M coder processor inputs and M coder processor outputs; an analysis filter means including M analysis filters each having one analysis input and two analysis outputs, each of said outputs being a signal having a sampling rate $F_S/M$ and being an output of said analysis filter means; and means for dividing the digital signal band into successive subbands having approximately equal bandwidths, and applying a respective subband signal to each analysis input, each said analysis filter applies two different filterings to the respective subband signal applied to the analysis filter input, and supplies a respective filtered signal to each of said two outputs, each of said two outputs being coupled to a respective one of said 2M processor inputs, said coder processor comprises means for combining said processor inputs to form said processor outputs, each processor output being a respective combination of at least one of said processor inputs, said M processor outputs being coupled respectively to M outputs of the coder for supplying the M subband signals, said decoder comprises a decoder processor having M decoder processor inputs and 2M decoder processor outputs; a synthesis filter means including M synthesis filters each having two synthesis filter inputs and one synthesis filter output; and means for receiving M subband signals and applying a respective one of the M subband signals to each decoder processor input as a decoder input signal, said decoder processor comprises means for generating a respective pairs of decoder output signals on respective pairs of the 2M decoder processor outputs, said respective decoder output signal being a combination of at least one decoder input signal, each pair of decoder output signals being coupled to a pair of two inputs of a corresponding one of said M synthesis filters, each said synthesis filter applies two different filterings to signals coupled to the respective pair of synthesis filter inputs, to form respective synthesized signals, and supplies a combination of the synthesized signals to the respective synthesis filter output, each of said synthesis filter outputs being coupled to said synthesis filter means output for supplying a replica of said digital signal having a sampling rate $F_S$, and each of the analysis and synthesis filters has coefficients derived from an odd number of coefficients of a standard filter having a low pass filter characteristic with a bandwidth approximately equal to half the bandwidth of the subbands.

2. A digital transmission system as claimed in claim 1, characterized in that the analysis filter means comprises a first unit having an input coupled to the input of the coder, for receiving the samples of the digital signal and M outputs for supplying M output signals with a sampling rate of $F_S/M$, the first unit being adapted to supply to the M outputs each time M samples that occur in consecutive blocks of M samples of the digitized input signal, such that the m-th sample of each block is supplied to the m-th output, each of the M outputs being coupled to an input of a corresponding one of M analysis filters, the synthesis filter means further comprising a second unit having M inputs coupled to the M outputs of the synthesis filters and an output coupled to the output of the synthesis filter means, the second unit being adapted to arrange M samples, each time when they are present at the M inputs, one after the other in one block of consecutive blocks of M samples, such that the samples received at the m-th input are positioned in the m-th position in the consecutive blocks, the blocks being supplied to the output.

3. A system as claimed in claim 1, or 2 characterized in that each analysis filter comprises a series arrangement of delay sections having equal delay (T), the output of each analysis filter being coupled to the input of the first delay section, outputs of at least a number of odd numbered delay sections in the series arrangement being coupled to corresponding inputs of a first signal combination unit, outputs of least a number of even numbered delay sections in the series arrangement being coupled to corresponding inputs of a second signal combination unit, outputs of the first and second signal combination unit being coupled to the first and second output respective of said analysis filter.

4. A system as claimed in 1, or 2, characterized in that each analysis filter comprises two series arrangements of delay sections having equal delay (2T), the input of the analysis filter being coupled to the inputs of the first and at least a number of other delay sections in each series arrangement, the outputs of the two series arrangements being coupled to the first and second output of the analysis filter respectively, a further delay section having a delay (T) that equals half the delay of the delay sections in the series arrangements, being coupled in the signal path from the input to the second output of the analysis filter, the said further delay section not being included in the signal path from the input to the first output of the analysis filter.

5. A system as claimed in claim 3, characterized in that outputs of odd numbered delay sections are coupled to inputs of the first signal combination unit only, and outputs of even numbered delay sections are coupled to inputs of the second signal combination unit only.

6. A system as claimed in claim 3, characterized in that the outputs of the delay sections are coupled to the corresponding inputs of the first or second signal combination unit via multiplication units.

7. A system as claimed in claim 3, characterized in that each analysis filter input is coupled to an input of the second signal combination unit via a multiplication unit.

8. A system as claimed in claim 4, characterized in that each analysis filter input is coupled to the corresponding inputs of the delay sections via multiplication units.

9. A system as claimed in claim 8, characterized in that an output of a multiplication unit is coupled to a first input of a signal combination unit, a second input of the signal combination unit being coupled to an output of a delay section in one of the two series arrangements, an output of the signal combination unit being coupled to an input of the next delay section in the said series arrangement.

10. A system as claimed in claim 4, characterized in that each analysis filter input is coupled to the first and second output via a first and second signal path respectively, the said first and second signals paths each including a multiplication unit and being connected in parallel to the first and second series arrangement respectively.

11. A system as claimed in claim 1, or 2 characterized in that each synthesis filter comprises two series arrangements of delay sections, having equal delay (2T), the first and second inputs of the synthesis filter being coupled to an input of the first delay section of the first and second series arrangement respectively, outputs of at least a number of delay sections in the first series arrangement being coupled to corresponding inputs of a signal combination unit, outputs of at least a number of delay sections in the second series arrangement also being coupled to corresponding inputs of the signal combination unit, an output of the signal combination unit being coupled to the synthesis filter output, a further delay section having a delay (T) that equals half the delay of the delay sections in the series arrangements, being coupled in the signal path from the second input to the output of the synthesis filter, the said further delay section not being included in the signal path from the first input to the output of the synthesis filter.

12. A system as claimed in claim 1 or 2, characterized in that each synthesis filter comprises a series arrangement of delay sections having equal delay (T), the first input of the synthesis filter being coupled to inputs of at least a number of odd numbered delay sections in the series arrangement, the second input of the synthesis filter being coupled to inputs of at least a number of even numbered delay sections in the series arrangement, the output of the last delay section being coupled to the output of the synthesis filter.

13. A system as claimed in claim 12, characterized in that the first synthesis filter input is coupled to inputs of odd numbered delay sections only, and the second synthesis filter, input is coupled to inputs of even numbered delay sections only.

14. A system as claimed in claim 11, characterized in that the outputs of the delay sections of the first and second series arrangements are coupled to corresponding inputs of the signal combination unit via multiplication units.

15. A system as claimed in claim 11, characterized in that the first and second filter input are also coupled to corresponding inputs, of the signal combination unit via multiplication units.

16. A system as claimed in claim 12, characterized in that the synthesis filter inputs are coupled to the inputs of the delay sections via multiplication units.

17. A system as claimed in claim 16, characterized in that an output of a signal multiplication unit is coupled to a first input of a signal combination unit, a second input of the signal combination unit being coupled to an output of a delay section in the series arrangement, an output of the signal combination unit being coupled to an input of the next delay section in the series arrangement.

18. A system as claimed in claim 12, characterized in that each second synthesis filter input is coupled to the corresponding synthesis filter output via a signal path, the said signal path including a multiplication unit and being connected in parallel to the series arrangement.

19. A system as claimed in claim 1 or 2, characterized in that the coder processor comprises M signal combination units, each having an output coupled to a corresponding one of the M outputs of the coder processor, in that for each signal combination unit, at least a number of inputs of the 2M inputs of the coder processor are coupled to corresponding inputs of said signal combination unit, via corresponding multiplication units.

20. A system as claimed in claim 1 or 2, characterized in that the decoder processor comprises 2M signal combination units, each having an output coupled to a corresponding one of the 2M outputs of the decoder processor, in that, for each signal combination unit, at least a number of inputs of the M inputs of the decoder processor are coupled to the corresponding inputs of the said signal combination unit, via corresponding multiplication units.

21. A system as claimed in claim 1 or 2, characterized in that the two outputs of each analysis filters are each coupled to their corresponding inputs of the coder processor via a corresponding signal amplification unit, both amplification units being adapted to amplify the signals applied to their inputs by a same complex value.

22. A system as claimed in claim 21, characterized in that the complex values are different for amplification unit coupled to different analysis filters.

23. A system as claimed in claim 21 characterized in that each output of the coder processor is coupled to its corresponding output of the coder via a series arrangement of a signal amplification unit and real value determinator, the signal amplification unit being adapted to amplify the signal applied to its input by a further complex value.

24. A system as claimed in claim 1 or 2, characterized in that the two outputs of each pair of outputs of the decoder processor are each coupled to their corresponding input of a synthesis filter via a corresponding signal amplification unit, both amplification units being adapted to amplify the signals applied to their inputs by a same complex value.

25. A system as claimed in claim 24, characterized in that the complex values are different for amplification units coupled to different synthesis filters.

26. A system as claimed in claim 1 or 2, characterized in that the M inputs of the decoder are each coupled to their corresponding one of the M inputs of the decoder processor via a signal amplification unit, the signal amplification unit being adapted to amplify the signal applied to its input by a further complex value.

27. A system as claimed in claim 23 characterized in that the further complex values are different from each other.

28. A system as claimed in claim 6, characterized in that those multiplication units for which the multiplication factors with which they multiply their input signals, equal one, that are dispensed with.

29. A system as claimed in claim 6, characterized in that those couplings that include a multiplication unit for which the multiplication factor with which it multiplies its input signal, equals zero, are dispensed with.

30. A system as claimed in claim 1 or 2 characterized in that the coder processor comprises a switching means and M signal combination units, each of the 2 M inputs of the coder processor being coupled to a corresponding one of 2 M inputs of the switching means, the switching means having one output coupled to an input of each of the M signal combination units each signal combination unit comprising a multiplication unit, a memory having 2 M storage locations, an adder and an accumulating register, the input of each respective signal combination unit and an output of the memory being coupled to a first and second input respectively of the multiplication unit, an output of the respective multiplication unit and the respective accumulating register being coupled to a first and second input respective of the adder, the adder having an output coupled to an input of the respective register, the output of the register of the m-th signal combination unit being coupled to the m-th output of the coder processor, the switching means being adapted to cyclically couple each of its 2 M inputs with its output, so as to apply each time the samples in blocks of 2 M samples that occurs at its 2 M inputs, one sample at each input, serially to its output, each memory comprising 2 M multiplication factors and being adapted to supply in a circular fashion the 2 M multiplication factors to its output, in such a way that the i-th multiplication factor is suppled to its output, when the switching means supplies the i-th sample of the 2 M samples in a block to its output, where i runs from 1 to 2 M, the respective adder and accumulating register being adapted to add the result of the i-th multiplication to the contents contained in the respective accumulating register, each accumulating register further being adapted to supply its contents obtained after the 2 M-th multiplication step to the output of the coder processor and to set its contents to zero thereafter.

31. A system as claimed in claim 1, or 2, characterized in that the decoder processor comprises a switching means and 2M signal combination units, each of the M inputs of the decoder processor being coupled to a corresponding one of M inputs of the respective switching means, each switching means having one output coupled to an input of each of the 2M signal combination units, each signal combination unit comprising a multiplication unit, a memory having M storage locations, an adder and an accumulating register, a respective input of the signal combination unit and an output of the memory being coupled to a first and second input respectively of the multiplication unit, an output of the respective multiplication unit and the accumulating register being coupled to a first and second input respectively of the corresponding adder, each adder having an output coupled to an input of the respective register, the output of the register of the i-th signal combination unit being coupled to the i-th output of the decoder processor, where i runs from 1 to 2 M, each switching means being adapted to cyclically couple each of its M inputs with its output, so as to apply each time the samples in blocks of M samples that occur at its M inputs, one sample at each input, serially to its output, each memory comprising M multiplication factors and being adapted to supply in a circular fashion the M multiplication factors to its output, in such a way that the m-th multiplication factor is supplied to its output, when the respective switching means applies the m-th sample of the M samples in a block to its output, each adder and accumulating register being adapted to add the result of the m-th multiplication to the contents contained in the respective accumulating register, each accumulating register further being adapted to supply its contents obtained after the M-th multiplicator step to the output of the respective signal combination unit and to set its contents to zero thereafter.

32. A transmitter, for use in a system as claimed in claim 1, or 2.

33. A receiver, for use in a system as claimed in claim 1 or 2.

34. Coder, for use in the transmitter as claimed in claim 32.

35. Decoder, for use in the receiver as claimed in claim 33.

36. Analysis filter, for use in the coder as claimed in claim 34.

37. Synthesis filter, for use in the decoder as claimed in claim 35.

38. A digital audio signal recording apparatus for recording a digital audio signal on a record carrier, comprising the transmitter as claimed in claim 32, characterized in that it further comprises recording means having M inputs, each one of the M inputs being coupled to a corresponding one of the M outputs of the coder processor, the recording means being adapted to write the M subband signals applied to its M inputs in a track on the record carrier.

39. A digital audio signal reproduction apparatus for reproducing a digital audio signal from a record carrier, comprising the receiver as claimed in claim 33, characterized in that it further comprises reproducing means having M outputs, each one of the M outputs being coupled to a corresponding one of the M inputs of the decoder processor, the reproducing means being adapted to read the M subband signals from a track on the record carrier.

* * * * *

UNITED STATES PATENT AND TRADEMARK OFFICE
CERTIFICATE OF CORRECTION

PATENT NO. : 5,214,678
DATED : May 25, 1993
INVENTOR(S) : Jean B. Rault, Yves F. Dehery, Jean Y. Roudaut, Alphons A.M.L. Bruekers and Raymond N.J. Veldhuis It is certified that error appears in the above-identified patent and that said Letters Patent is hereby corrected as shown below:

<u>Title page,</u>
Item [57], ABSTRACT,
Line 1, delete "is disclosed".

<u>Column 19,</u>
Line 55, delete ".";
Line 59, insert -- , --;

<u>Column 20,</u>
Line 6, change "occurs" to -- occur --.

Signed and Sealed this

Twelfth Day of November, 2002

Attest:

JAMES E. ROGAN
Attesting Officer          Director of the United States Patent and Trademark Office